(12) United States Patent
Starovoytov

(10) Patent No.: US 7,872,890 B1
(45) Date of Patent: Jan. 18, 2011

(54) COUNTER CIRCUIT FOR REGULAR EXPRESSION SEARCH ENGINES

(75) Inventor: Alexey Starovoytov, Los Gatos, CA (US)

(73) Assignee: NetLogic Microsystems, Inc., Santa Clara, CA (US)

(*) Notice: Subject to any disclaimer, the term of this patent is extended or adjusted under 35 U.S.C. 154(b) by 52 days.

(21) Appl. No.: 12/538,852

(22) Filed: Aug. 10, 2009

Related U.S. Application Data

(60) Provisional application No. 61/087,581, filed on Aug. 8, 2008.

(51) Int. Cl.
*G11C 15/00* (2006.01)

(52) U.S. Cl. .................. 365/49.17; 365/236; 365/49.1

(58) Field of Classification Search .............. 365/49.17, 365/236, 49.1, 189.07; 711/108
See application file for complete search history.

(56) References Cited

U.S. PATENT DOCUMENTS

| | | | |
|---|---|---|---|
| 7,206,212 B1 | 4/2007 | Chou | |
| 7,272,684 B1 | 9/2007 | Chou | |
| 7,353,332 B2 | 4/2008 | Miller et al. | 711/108 |
| 7,529,746 B2 | 5/2009 | Ichiriu et al. | 707/5 |
| 7,539,031 B2 | 5/2009 | Ninan et al. | 365/49.1 |
| 7,539,032 B2 * | 5/2009 | Ichiriu et al. | 365/49.17 |
| 7,555,594 B2 | 6/2009 | Venkatachary | |
| 7,581,059 B2 | 8/2009 | Gupta et al. | |
| 7,624,105 B2 | 11/2009 | Ichiriu et al. | 707/4 |
| 7,643,353 B1 | 1/2010 | Srinivasan et al. | 365/49.17 |
| 7,644,080 B2 | 1/2010 | Mammen et al. | 707/6 |
| 7,656,716 B1 | 2/2010 | Srinivasan et al. | 365/49.17 |
| 7,660,140 B1 | 2/2010 | Joshi et al. | 365/49.17 |
| 2008/0212581 A1 | 9/2008 | Miller et al. | 370/389 |
| 2010/0054013 A1 | 3/2010 | Joshi et al. | 365/49.17 |

* cited by examiner

*Primary Examiner*—David Lam
(74) *Attorney, Agent, or Firm*—Mahamedi Paradice Kreisman LLP; William L. Paradice

(57) ABSTRACT

A counter circuit is configured to simultaneously maintain individual character match count values for a plurality of overlapping substrings of an input string of characters that match a portion of a regular expression stored in a plurality of rows of content addressable memory (CAM) cells of a ternary CAM device. The counter circuit is selectable between a normal operational mode in which all matching portions of the input string are identified, and a minimum match length operational mode in which only matching portions of the input string that have at least a specified minimum number of characters are identified.

32 Claims, 16 Drawing Sheets

$R_A = a(bc|de)\{50\}f$ $R_B = ab\{n\}c$ $R_C = a.\{0,n\}b$ $R_D = a.\{n,\}b$ $R_E = a.\{n,\}?b$ $R_F = a.+?b$ $R_G = a.*?b$

REG2 = "ab(cd|ef|gh)uv"

US 7,872,890 B1

COUNTER CIRCUIT FOR REGULAR EXPRESSION SEARCH ENGINES

CROSS-REFERENCE TO RELATED APPLICATION

This application claims the benefit under 35 USC 119(e) of the commonly owned U.S. Provisional Application No. 61/087,581 entitled "Counter Circuit For Regular Expression Search Engines" filed on Aug. 8, 2008, which is incorporated by reference herein.

TECHNICAL FIELD

The present invention relates generally to regular expression search operations, and more specifically to counters used to detect and count multiple overlapping substrings of an input string that match a portion of a regular expression.

BACKGROUND OF RELATED ART

Regular expression search operations are employed in various applications including, for example, intrusion detection systems (IDS), virus protections, policy-based routing functions, internet and text search operations, document comparisons, and so on. A regular expression can simply be a word, a phrase or a string of characters. For example, a regular expression including the string "gauss" would match data containing gauss, gaussian, degauss, etc. More complex regular expressions include metacharacters that provide certain rules for performing the match. Some common metacharacters are the wildcard ".", the alternation symbol "|", and the character class symbol "[ ]." Regular expressions can also include quantifiers such as "*" to match 0 or more times, "+" to match 1 or more times, "?" to match 0 or 1 times, $\{n\}$ to match exactly n times, $\{n,\}$ to match at least n times, and $\{n,m\}$ to match at least n times but no more than m times. For example, the regular expression "a.$\{2\}$b" will match any input string that includes the character "a" followed exactly 2 instances of any character followed by the character "b" including, for example, the input strings "abbb," adgb," "a7yb," "aaab," and so on.

For hardware-based regular expression search engines, counters are employed to count the number of characters of an input string that match a quantified character or character class of a regular expression. However, for complex regular expressions in which multiple overlapping substrings of an input string can concurrently match the regular expression, multiple counters are required to maintain a separate count value for each potentially matching substring. Because there is no limit upon the number of potentially matching substrings for search operations involving some regular expressions, using a separate counter for each potentially matching substring is not practical. Thus, there is a need for a counter circuit in a hardware-based regular expression search engine that can simultaneously maintain a plurality of separate character match count values for a plurality of overlapping input substrings that match a portion of a regular expression.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

A search engine is disclosed that includes one or more counter circuits embedded in a ternary content addressable memory (TCAM) device having a programmable interconnect structure (PRS) that can be configured to selectively connect any number of the counter circuits and rows of the TCAM device together to implement search operations for most regular expressions. The PRS allows data words spanning multiple CAM rows to be stored in any available CAM rows in the array, without regard to their physical locations relative to one another. The PRS also allows the match signal from any CAM row to be simultaneously routed as an input signal to any number of the CAM rows and/or to the counter circuits, and allows the output signals of any counter circuit to be simultaneously routed as input signals to any number of the CAM rows and/or counter circuits. In this manner, the TCAM device can store most regular expressions in their unrolled form, thereby minimizing the number of CAM rows required to store the regular expressions.

The counter circuit disclosed herein is suited to implement various quantifiers in regular expressions without unrolling the regular expressions and without the use of shift registers or FIFO buffers to maintain separate count values for multiple overlapping portions of an input string that potentially match a regular expression, thereby allowing regular expression search operations to be performed using a TCAM-based search engine having minimal counter resources. In addition, some embodiments of the counter circuits disclosed herein can be selectively enabled to identify matching portions of the input string that have a specified minimum number of characters. For such embodiments, the counter circuit is responsive to a mode select signal that indicates a normal (NRML) mode of operation or a minimum match length (MML) mode of operation.

Figure 1:
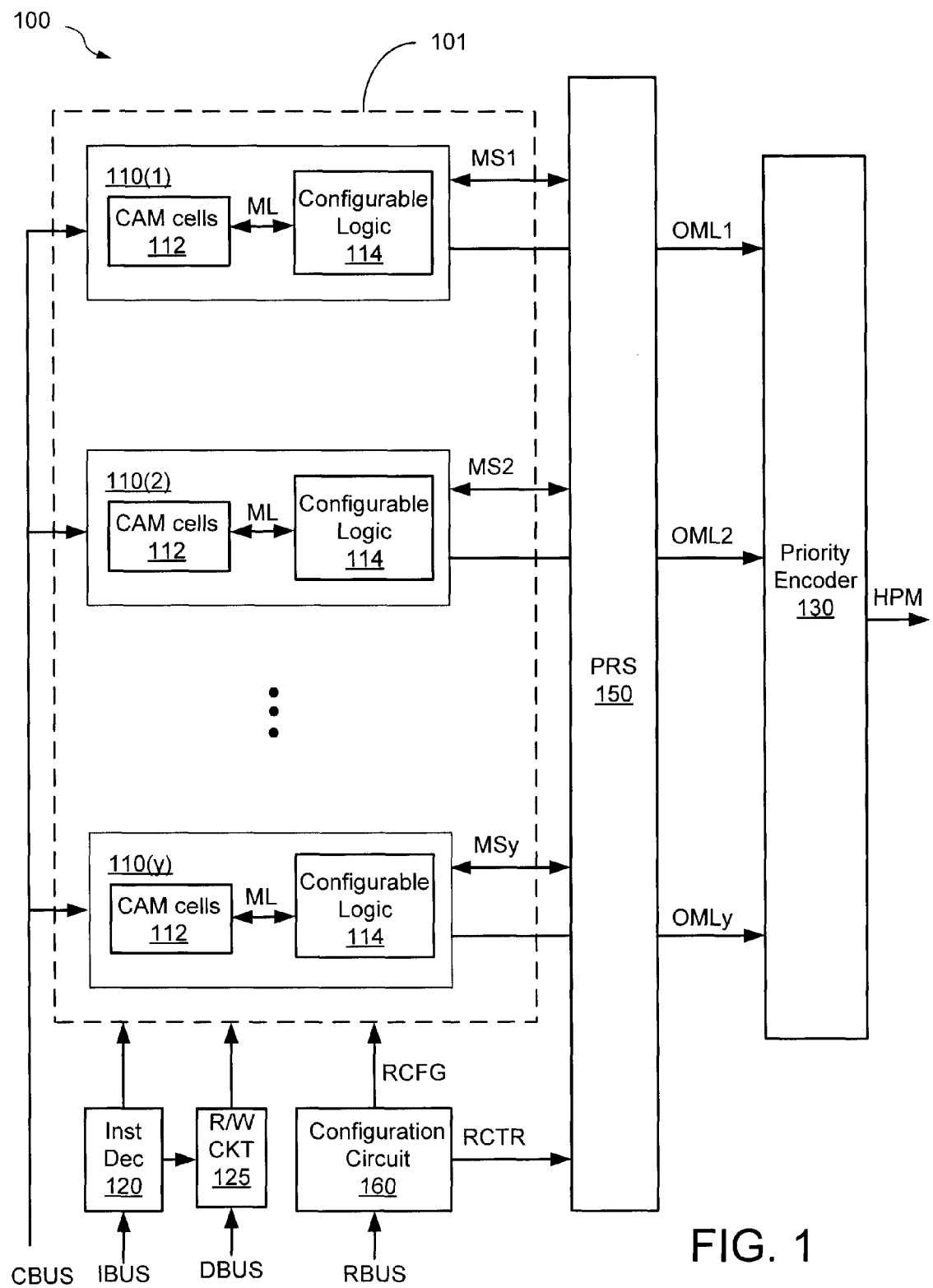
FIG. 1 shows a simplified block diagram of a content addressable memory (CAM) device having a programmable interconnect structure (PRS) connected to CAM rows in accordance with some embodiments.

FIG. 1 is a functional block diagram of a CAM device 100 according to some embodiments. CAM device 100 includes a CAM array 101, an instruction decoder 120, a read/write circuit 125, a priority encoder 130, a programmable interconnect structure (PRS) 150, and a configuration circuit 160. Other well-known components and control signals, for example, such as an address decoder, comparand register, and clock signals, are not shown for simplicity.

CAM array 101 includes a plurality of rows 110(1)-110(y), each having a number of CAM cells 112 and a configurable logic circuit 114. Each CAM row 110 is coupled to a comparand bus CBUS via a well-known comparand register (not shown for simplicity), and is coupled to the PRS 150 via match signal (MS) lines and to the priority encoder 130 via output match lines (OML). CAM cells 112 can be any suitable type of CAM cells including, for example, binary CAM cells, ternary CAM cells, and/or quaternary CAM cells. For each CAM row 110, the CAM cells 112 are coupled to the configurable logic circuit 114 via match lines, which can provide match signals from CAM cells 112 to configurable logic circuit 114, and for some embodiments can also provide match signals from configurable logic circuit 114 as enable signals to CAM cells 112. The configurable logic circuits 114 can be programmed or configured using row configuration data (RCFG) to selectively route match signals to priority encoder 130 via the output match lines (OML), to route the match signals to the PRS 150 via the MS lines, and/or to selectively combine the row match signals with match signals from one or more other CAM rows provided on the MS lines by the PRS 150.

Priority encoder 130, which is well-known, has inputs coupled to the output match lines (OML) from the CAM rows 110, and has an output to generate the index of the highest priority matching CAM row 110 (e.g., the HPM index). Although not shown for simplicity, each row of CAM cells 112 can include a validity bit (V-bit) that indicates whether valid data is stored in the CAM row, and the V-bits can be provided to the priority encoder 130 to determine the next free address in the CAM array for storing new data.

Instruction decoder 120 decodes instructions provided on the instruction bus IBUS, and provides control signals to CAM cells 112 and to read/write circuit 125 that control read, write, and compare operations in CAM array 101. For other embodiments, instruction decoder 120 can decode the instructions and provide configuration information to configurable logic circuits 114.

Read/write circuit 125, which is well-known, controls read and write operations for CAM array 101. For example, during write operations, data is provided to read/write circuit 125 via a data bus (DBUS), or alternately from CBUS, and in response to control signals provided by instruction decoder 120, read/write circuit 125 writes the data into the CAM cells 112 of the row or rows selected for the write operation. During read operations, data is output in a well-known manner from one or more selected CAM rows 110 to read/write circuit 125, which in turn provides the data onto DBUS.

The PRS 150 includes a plurality of signal routing lines (not shown individually in FIG. 1 for simplicity) extending across the rows 110 of CAM cells 112 and programmably connected to the match signal (MS) lines in each CAM row 110 in response to routing control signals (RCTR). As explained in more detail below, the RCTR signals control the configuration of a plurality of programmable switch matrixes (not shown in FIG. 1 for simplicity) that selectively connect the MS lines of the various CAM rows 110 to the signal routing lines within the PRS 150. The PRS 150 can be implemented using any suitable circuits and/or logic (e.g., switch matrixes, crossbar circuits, programmable switches, and so on) that selectively routes the row match signals from each CAM row to any number of arbitrarily selected CAM rows (e.g., regardless of whether the selected CAM rows are adjacent to one another) at the same time.

Configuration circuit 160 includes an input coupled to a regular expression bus (RBUS), first outputs coupled to CAM array 101, and second outputs coupled to the PRS 150. For some embodiments, configuration information (e.g., which can embody one or more regular expressions) can be provided to configuration circuit 160 via RBUS, and in response thereto configuration circuit 160 provides the row configuration information (RCFG) to configurable logic circuits 114 and provides the routing control signals (RCTR) to the PRS 150. For one embodiment, configuration circuit 160 includes a configuration memory (not shown for simplicity in FIG. 1) for storing RCFG and RCTR information received from RBUS. Together, the RCFG and RCTR information form configuration data that can be used to program the CAM device 100 to implement search operations for one or more regular expressions, as described below.

For other embodiments, RCFG can be provided to row configurable logic circuits 114 using other techniques. For example, for another embodiment, RCFG can be provided to configurable logic circuits 114 using the instruction decoder 120 and/or stored in memory elements (not shown for simplicity) within the CAM rows 110. Similarly, for other embodiments, the RCTR signals can be provided to the PRS 150 using other techniques. For example, for another embodiment, the RCTR signals can be provided to the PRS using the instruction decoder 120 and/or stored in memory elements (not shown for simplicity) within the PRS 150.

In accordance with present embodiments, the PRS 150 can be selectively configured to route the match signals from any CAM row 110 as an input match signal to any number of other arbitrarily selected or located CAM rows 110 at the same time, regardless of whether the other selected CAM rows are contiguous with one another. Further, for some embodiments, the PRS 150 can be configured to route match signals from one CAM row as the input match signal to the same row. The input match signals can be used as row enable or trigger signals to selectively enable the CAM rows for subsequent compare operations, and can therefore be used to logically connect a number of arbitrarily selected CAM rows together. As described below, CAM devices employing CAM arrays configured in accordance with present embodiments provide numerous functional and performance advantages over conventional CAM devices.

First, because the PRS 150 can route the match signals from any CAM row 110 in CAM array 101 to any number of arbitrarily selected CAM rows 110 in the array 101, a data word chain spanning a multiple number N of CAM rows can be stored in any available N CAM rows 110 of CAM array 101, even if none of the available CAM rows are contiguous or adjacent to each other, by configuring the PRS 150 to logically connect the available CAM rows together to form a data word chain. Thus, for example, if CAM array 101 of FIG. 1 includes 5 available but non-contiguous CAM rows 110, then the PRS 150 can be programmed to logically connect the 5 available CAM rows 110 into a chain that can store a data word chain spanning 5 CAM rows. In contrast, to store a new 5 data word chain in a prior CAM device such as disclosed in U.S. Pat. No. 6,252,789, a block of 5 available and contiguous CAM rows are needed. Thus, if there are 5 available but non-contiguous CAM rows in the CAM device of the '789 patent, the new 5 data word chain can be stored therein only if the existing contents of the CAM array are re-arranged to create a block of 5 available contiguous CAM rows, which undesirably requires burdensome and time-consuming table management tools.

Second, by allowing match signals from one CAM row to be routed to any number of selected CAM rows (e.g., including the same CAM row) as input match signals at the same time, embodiments of the present invention can store many regular expressions using significantly fewer numbers of CAM rows than conventional CAM devices. More specifically, because the PRS 150 can simultaneously and independently route the match signals from any CAM row 110 to any number of other CAM rows 110 at the same time, embodiments of CAM device 100 can store a regular expression in its rolled format (e.g., its original form), for example, because each common portion of all the different strings that can match the regular expression can be stored in a corresponding single location (e.g., in one CAM row or one group of CAM rows), and their match signals can be simultaneously routed to multiple other locations that store other non-common portions of the possible matching strings. In contrast, storing a regular expression in CAM devices such as those disclosed in U.S. Pat. No. 6,252,789 requires unrolling the regular expression to generate all possible matching strings of the regular expression, and then storing each of the possible matching strings in a corresponding group of contiguous CAM rows.

Figure 7B:
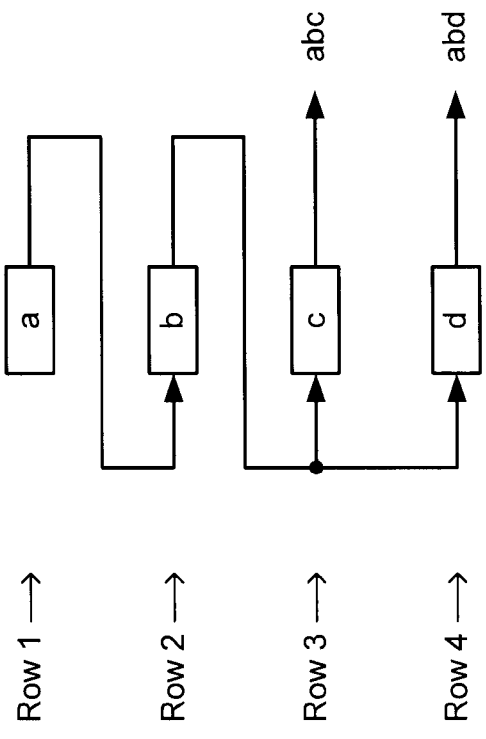
FIG. 7B depicts an exemplary CAM device configured in accordance with present embodiments to store REG1="ab(c|d)" using only 4 CAM rows.
Figure 7A:
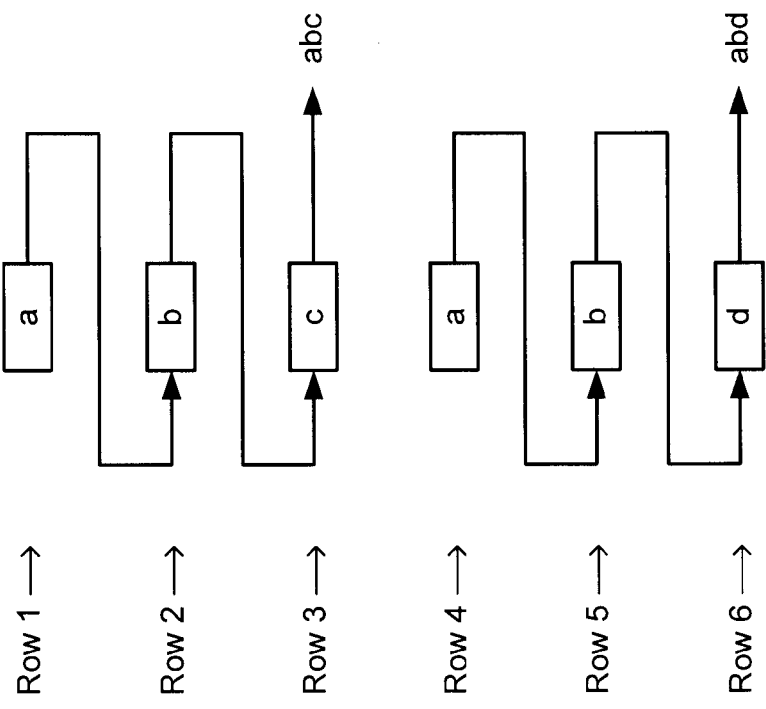
FIG. 7A depicts a prior art CAM device requiring 6 CAM rows to store the regular expression REG1="ab(c|d)"

For example, assuming each CAM row stores one 8-bit ASCII encoded character, the CAM device of the '789 patent requires 6 CAM rows to store the regular expression REG1="ab(c|d)." More specifically, to store REG1="ab(c|d)" in the CAM device of the '789 patent, REG1 is unrolled to generate the 2 possible matching strings "abc" and "abd," which are then stored as 2 separate data word chains each spanning 3 contiguous CAM rows, as depicted in FIG. 7A, where contiguous CAM rows 1-3 are cascade connected to form a first data word chain that stores the string "abc," and contiguous CAM rows 4-6 are cascade connected to form a second data chain that stores the string "abd."

In contrast, the dynamic configurability of PRS 150 allows CAM device 100 to store REG1="ab(c|d)" in its rolled format using only 4 CAM rows because the common portion "ab" of the two possible matching strings "abc" and "abd" can be stored in only one group of CAM rows and their match signals can be simultaneously routed to other CAM rows that store "c" and "d". For example, referring to FIG. 7B, the characters "a," "b," "c," and "d" can be stored in CAM rows 1-4, respectively, of CAM device 100, and the match signal of the common data word chain "ab" ending at row 2 can be simultaneously routed as input match signals to both CAM rows 3 and 4 so that CAM row 3 can detect a match with "abc" concurrently and independently of CAM row 4 detecting a match with "abd."

Figure 7C:
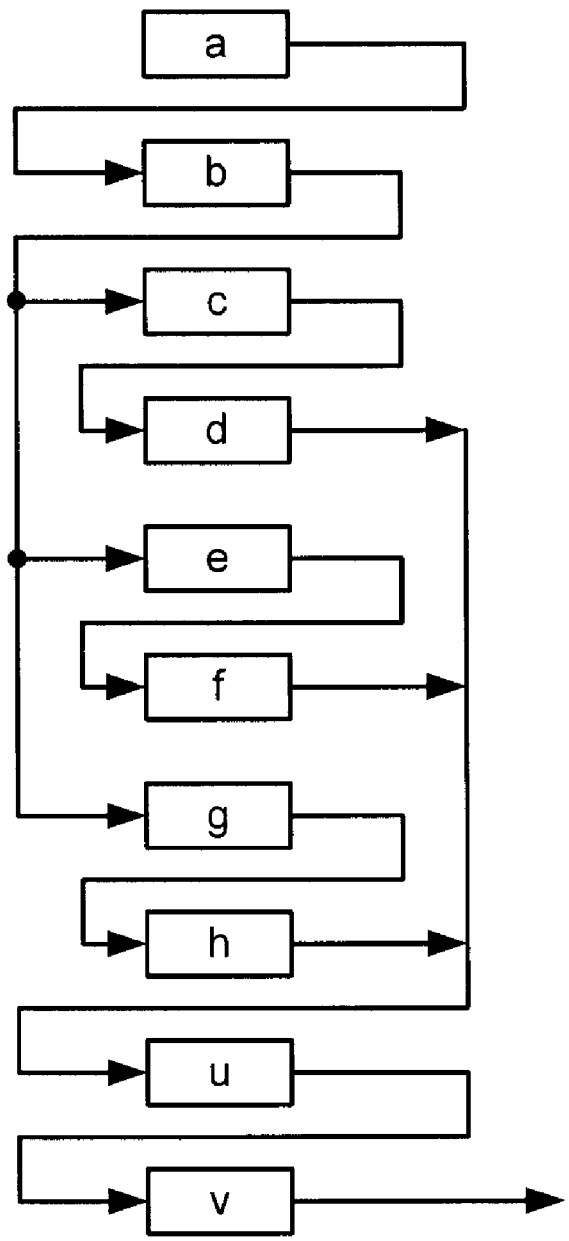
FIG. 7C depicts an exemplary CAM device configured in accordance with present embodiments to store the regular expression REG2="ab(cd|efl gh)uv" using only 10 CAM rows.

Note that as the number of possible matching strings of a regular expression increases, the reduction in memory area (e.g., the number of CAM rows) achieved by embodiments of the present invention also increases (e.g., as compared to the '789 patent). For example, as described above, the CAM device of the '789 patent requires 18 CAM rows to store the regular expression REG2="ab(cd|ef|gh)uv" because REG2 needs to be unrolled to generate all possible matching strings (i.e., S1="abcduv," S2="abefuv," and S3="abghuv"), which are then stored separately in 3 groups of 6 contiguous and sequentially connected CAM rows. However, because embodiments of CAM device 100 can selectively, simultaneously, and independently route the match signals from any CAM row to any number of other arbitrarily located CAM rows, REG2 does not need to be unrolled for storage in CAM device 100. Rather, each common portion of the possible matching strings of REG2 can be stored in only one location in the CAM array 101, and the PRS 150 can be programmed to route the match signals of the common portion to the other non-common portions at the same time according to the logical operators specified in REG2. In other words, the strings appearing between logical operators as expressed using the unrolled form of the regular expression can be stored in corresponding groups of CAM rows of the CAM device, and the PRS can be programmed to logically connect the groups of CAM rows according to the logical operators. In this manner, embodiments of CAM device 100 require only 10 CAM rows to store REG2="ab(cd|ef|gh)uv," as depicted in FIG. 7C.

Further, the ability of the PRS 150 to selectively route the match signal from each CAM row 110 in CAM array 101 to itself and/or to any number of other arbitrarily selected CAM rows 110 at the same time allows embodiments of CAM device 100 to implement search operations for regular expressions that include quantifiers such as the Kleene star "*." The Kleene star denotes zero or more instances of the preceding character in the regular expression. For example, to match the regular expression REG3="abc*de," an input string must include zero or more instances of the character "c" appearing between the prefix string "ab" and the suffix string "de." Thus, while the input strings "abde," abcde," and "abccde" all match REG3="abc*de," an input string including thousands, millions, or even an infinite number of instances of "c" between the prefix "ab" and the suffix "de" will also match REG3="abc*de."

Figure 7D:
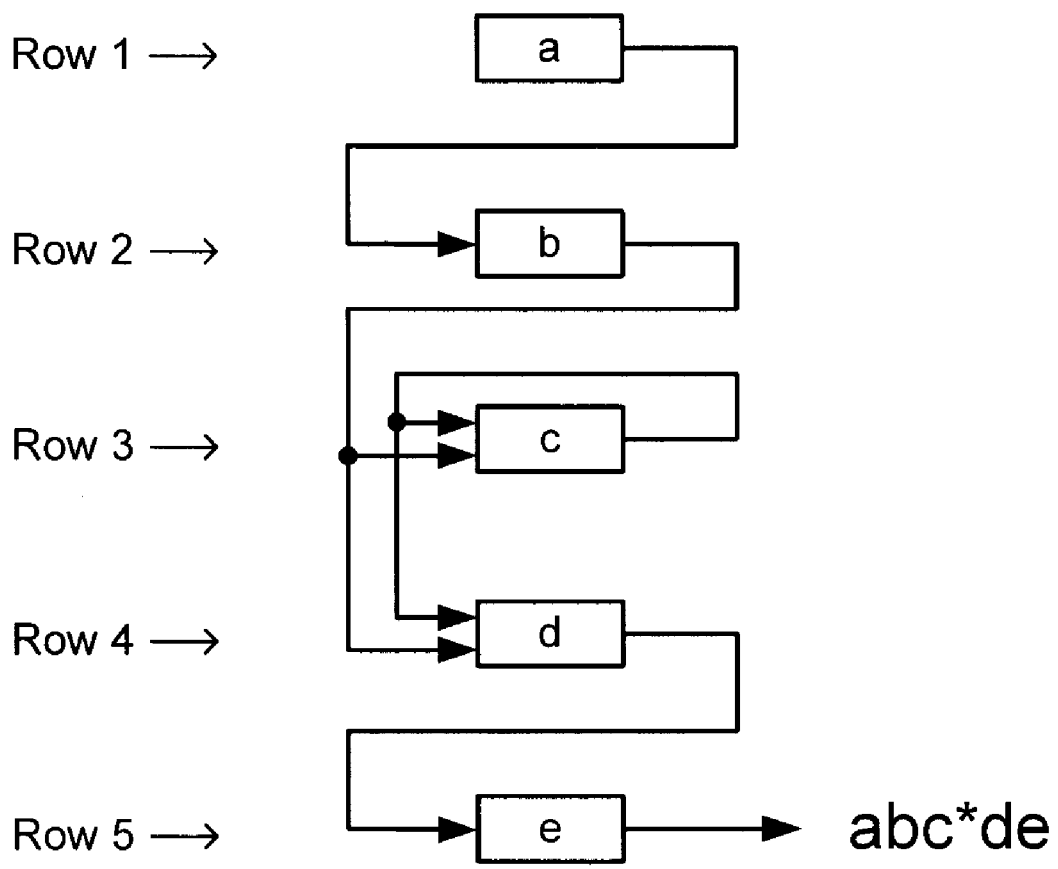
FIG. 7D depicts an exemplary CAM device configured in accordance with present embodiments to store the regular expression REG3="abc*de" using only 5 CAM rows.

Regular expressions that include the Kleene star "*" can be efficiently stored in embodiments of CAM device 100 by configuring the PRS 150 to form a match signal loop for the Kleene character and to route the match signals of the prefix string and the Kleene character as an enable or trigger signal for matching the suffix string. For example, FIG. 7D depicts an embodiment of CAM device 100 configured to store and implement search operations for REG3="abc*de." The characters "a," "b," "c," "d," and "e" are stored in CAM rows 1-5, respectively, of CAM device 100. The PRS 150 is configured to route the match signal from "a" in row 1 as an input match or enable signal to "b" in row 2 to form the prefix string "ab," and to route the match signal from "d" in row 4 as an input match or enable signal to "e" in row 5 to form the suffix string "de." Further, the PRS 150 is configured to route the match signal from the prefix string "ab" as an input match or enable signal to both "c" and the suffix string "de" so that a matching prefix "ab" in the input string triggers a search for both the Kleene character "c" and the suffix string "de," and to route the match signal from "c" as an input match or enable signal to both itself and to the suffix string "de" so that a matching character "c" in the input string triggers a search for another occurrence of "c" and for the suffix string "de" at the same time. In this manner, after the embodiment of CAM device 100 depicted in FIG. 7D detects the prefix string "ab" in the input string, if the next input characters are "de" or any number of the character "c" followed by the characters "de," a match condition can be indicated. Thus, as depicted in FIG. 7D, embodiments of CAM device 100 can be configured to store and implement search operations for REG3="abc*de" using only 5 CAM rows 110 (e.g., where each CAM row 110 stores one character) by using the PRS 150 to simultaneously trigger multiple sub-searches in response to a prefix match (e.g., routing the "ab" match signal to "c" and "d") and to implement a search loop of infinite repetitions (e.g., routing the "c" match signal back to "c").

In contrast, conventional CAM devices (e.g., such as those disclosed in U.S. Pat. No. 6,252,789) cannot implement search operations for regular expressions that include the Kleene star "*" because of the infinite number of different input patterns that can generate a match condition. As discussed above, to store a regular expression in the '789 CAM device, the regular expression is unrolled to generate all possible matching strings, which are then stored in corresponding groups of rows in the CAM device. Thus, to store and implement search operations for REG3="abc*de" in the '789 CAM device, every pattern that includes zero or more instances of "c" between the prefix "ab" and the suffix "de" must be stored therein, which is impossible because there are an infinite number of different input strings that can match REG3="abc*de."

Figure 2:
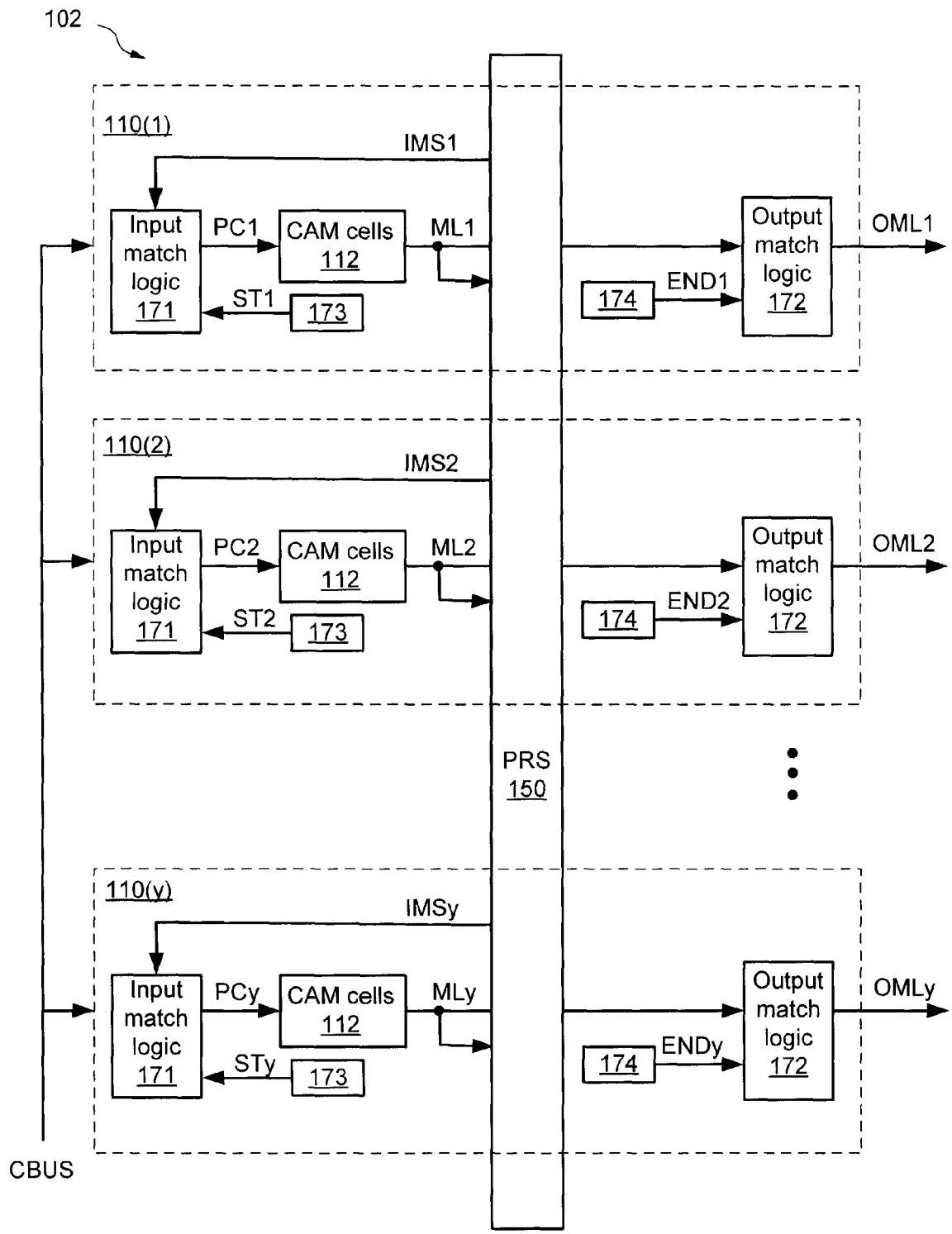
FIG. 2 shows a simplified block diagram of one embodiment of the CAM array of FIG. 1.

FIG. 2 shows a CAM array 102 that is one embodiment of CAM array 101 of FIG. 1. For the exemplary embodiment of FIG. 2, each CAM row 110 includes a number of CAM cells 112, input match logic 171, output match logic 172, and configuration memory cells 173-174. Each CAM row is selectively connected to the PRS 150, which as described above can route match signals from any CAM row to one or more arbitrarily selected CAM rows at the same time. Within each CAM row 110, the input match logic 171 includes a data input to receive match signals from the same or a number of other CAM rows 110 via the input match signal (IMS) lines, a control input to receive a start bit (ST) from configuration memory cell 173, and an output to provide a pre-charge signal PC to the CAM cells 112. Output match logic 172 includes a data input to receive match signals from the CAM cells 112 via the match lines ML during compare operations with input data, a control input to receive an end bit (END) from configuration memory cell 174, and an output coupled to priority encoder 130 via the output match line OML. Together, input match logic 171 and output match logic 172 form one embodiment of the configurable logic circuit 114 of FIG. 1.

The configuration memory cells 173-174 can be any suitable type of memory cells including, for example, an SRAM or DRAM cells, EEPROM cells, flash memory cells, fuses, and so on. Further, although depicted in FIG. 2 as being separate memory elements associated with corresponding CAM rows 110, for other embodiments, the memory cells 173-174 can be formed as an addressable array of configuration memory cells.

The start (ST) and end (END) bits for each row 110 in FIG. 2, which together represent the row configuration information (RCFG) for a corresponding CAM row of FIG. 1, control the logical operations and routing functions of the input match logic 171 and the output match logic 172, respectively, of the CAM row during compare operations. More specifically, the start bit (ST) indicates whether the data word stored in the corresponding CAM row is the first data word of a data word chain, and the end bit (END) indicates whether the data word stored in the corresponding CAM row is the last data word of a data word chain. The start bit and end bit can be further encoded, as shown below in Table 1, to indicate that the corresponding data word is a continuing data word or a default data word, where a continuing data word is an intermediate data word between the first and last data words in a data word chain that spans multiple CAM rows, and a default data word corresponds to a data word chain that has only one data word (and thus spans only one CAM row 110).

TABLE 1

| ST | END | Function |
| --- | --- | --- |
| 0 | 0 | continuing word |
| 0 | 1 | last word |
| 1 | 0 | first word |
| 1 | 1 | default word |

For some embodiments of CAM array 102 of FIG. 2, if the start bit ST of a row 110 is asserted, which indicates that the CAM row 110 stores the first data word in a chain, the asserted state of ST causes input match logic 171 to ignore any input match signals (e.g., received from the PRS 150 via the IMS line) and allows the match signal generated in response to a comparison between input data (e.g., an input character of the input string) and the data stored in the row's CAM cells 112 to be propagated as the output match signal for the row on the match line ML. Conversely, if ST of the row 110 is de-asserted, which indicates that the CAM row stores either an intermediate word or the last word in the data word chain, the de-asserted state of ST causes the row's input match circuit 171 to selectively enable compare operations between the input character and data stored in the row's CAM cells 112 in response to the input match signals received from the same and/or one or more other arbitrarily selected CAM rows (e.g. received from the PRS 150) to generate an output signal for the CAM row. In either case, the match signal on the row's match line is provided to both the PRS 150 and to the row's output match logic 172.

Further, if the end bit END of the CAM row 110 is asserted, which indicates that CAM row 110 stores the last data word in the chain, the asserted state of END causes the row's output match logic 172 to pass the row's match signal on its match line ML to the priority encoder 130 via its OML line. Conversely, if END for the CAM row 110 is de-asserted, which indicates that CAM row 110 does not store the last data word in the data word chain, the de-asserted state of END prevents the row's output match logic 172 from passing the row's match signal on ML to the priority encoder 130. The logic functions and output results provided by the CAM rows of FIG. 2 are summarized below in Table 2, where CMP indicates the results of a compare operation between an input character and data stored in the CAM cells 112 of the CAM row 110 and "*" indicates the logical AND function.

TABLE 2

| ST | END | ML | OML |
| --- | --- | --- | --- |
| 0 | 0 | IMS*CMP | 0 |
| 0 | 1 | IMS*CMP | IMS*CMP |
| 1 | 0 | CMP | 0 |
| 1 | 1 | CMP | CMP |

Thus, as described above, during search operations, input match logic 171 selectively enables CAM cells 112 for compare operations in response to ST and the input match signals provided on the IMS lines, and output match logic 172 selectively provides the row match signals from CAM cells 112 on ML to the priority encoder 130 via OML in response to END. As explained in more detail below, by selectively enabling the CAM row 110 in response to the IMS signals during compare operations, input match logic 171 can not only combine match signals from multiple CAM rows but can also minimize power consumption by pre-charging the match lines ML of only those CAM rows 110 that need to participate in a given compare operation while disabling all other CAM rows (e.g., that do not need to participate in the given compare operation.

Figure 3:
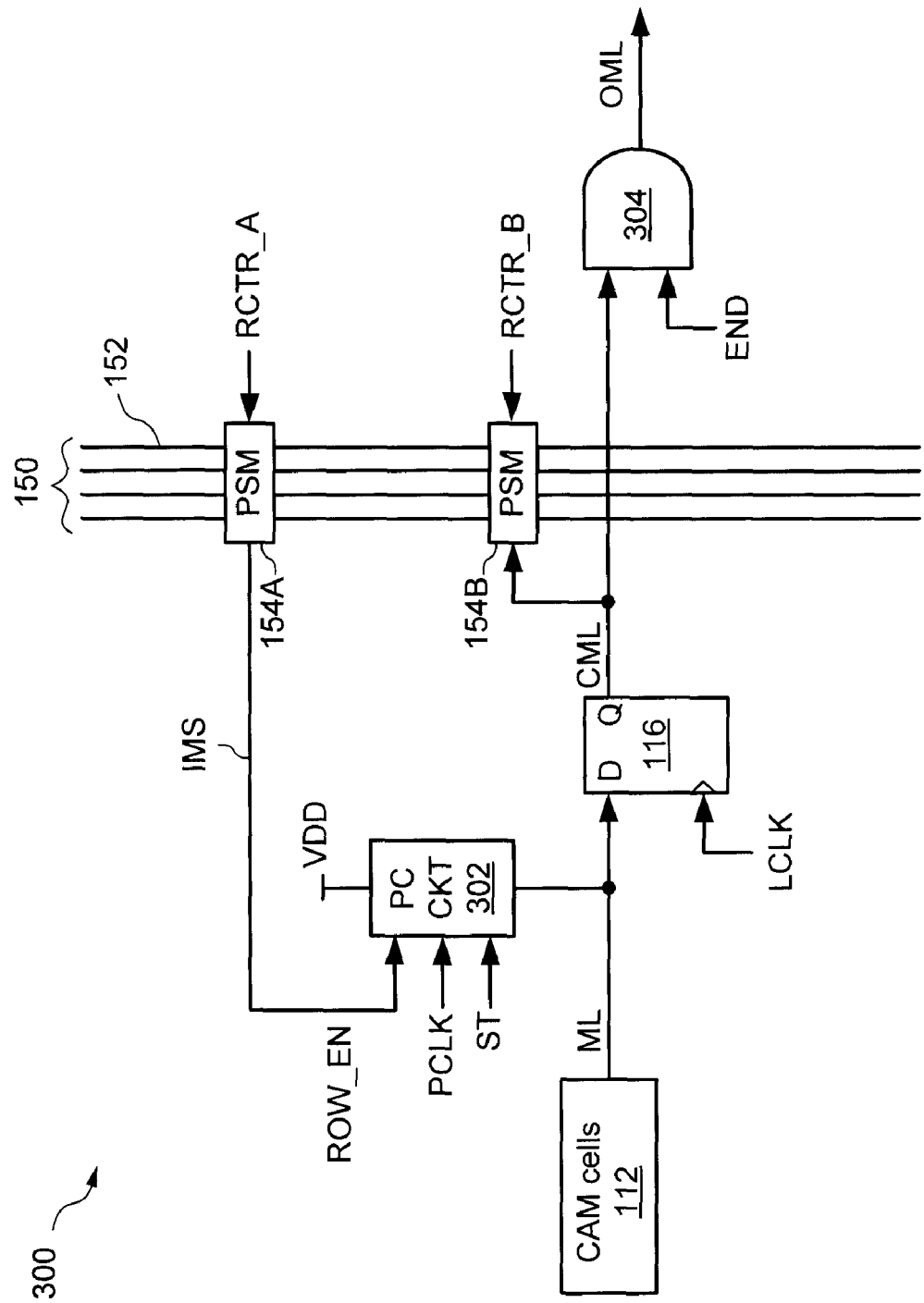
FIG. 3 shows a block diagram of one embodiment of the CAM rows of the CAM array of FIG. 2.

FIG. 3 shows a CAM row 300 that is one embodiment of CAM row 110 of CAM array 101 of FIG. 2. CAM row 300, which includes a number of CAM cells 112, a match signal latch 116, a match line pre-charge circuit (PC CKT) 302, and an AND gate 304, is selectively connected to PRS 150 via programmable switch matrixes (PSM) 154A-154B. CAM cells 112, which can be any suitable CAM cell for storing a data word and comparing the data word with a search key, can include binary CAM cells, ternary CAM cells, and/or quaternary CAM cells. CAM cells 112 receive a search key or comparand word from the comparand bus CBUS (not shown for simplicity in FIG. 3), and are coupled to match line ML.

Latch 116 includes a data input (D) coupled to ML, a clock input "<" to receive a latch clock signal (LCLK), and an output (Q) to provide clocked match signals on the clocked match line (CML) in response to LCLK. Latch 116, which can be any suitable latch or register circuit, latches the current match signals from CAM cells 112 onto CML. Although not shown for simplicity in FIG. 3, latch 116 also includes a terminal coupled to ground potential (VSS). The CML line is coupled to AND gate 304, and is also selectively connected to the signal routing lines 152 of PRS 150 via PSM 154B. AND gate 304 also includes a second input to receive the END bit for the row, and includes an output to provide the row output match signals to priority encoder 130 via the OML line. Thus, AND gate 304, which selectively forwards the match signal on CML to priority encoder 130 in response to END, is one embodiment of output match logic 172 of FIG. 2. Accordingly, if END is asserted (e.g., to logic high), AND gate 304 forwards the match signals on CML to the priority encoder 130 via OML. Conversely, if END is de-asserted (e.g., to logic low), then AND gate 304 does not forward the match signals on CML to the priority encoder 130.

Match line pre-charge circuit 302 has a first power terminal coupled to VDD, a second power terminal coupled to ML, a first input to receive ST for the row, a second input to receive a pre-charge clock signal PCLK, and a third input to selectively receive match signals from another CAM row via PRS 150 on the IMS line as a row enable signal (ROW_EN). Match line pre-charge circuit 302, which is one embodiment of input match logic 171 of FIG. 2, can be any suitable circuit that selectively pre-charges ML upon assertion of PCLK in response to ROW_EN and ST, as explained in more detail below. Together, match line pre-charge circuit 302 and AND gate 304 of CAM row 300 form another embodiment of configurable logic circuit 114 of FIG. 1.

PRS 150 is shown in FIG. 3 to include four signal routing lines 152 that can be selectively connected to the row's IMS lines via PSM 154A and/or to the row's CML line via PSM 154B. PSM 154A includes a control terminal to receive RCTR_A, which controls which signal routing lines 152 of the PRS 150 are connected to which (if any) IMS lines of row 300. PSM 154B includes a control terminal to receive RCTR_B, which controls which signal routing lines 152 are connected to the CML line of row 300. Thus, the routing control signals RCTR_A and RCTR_B, which can be stored in the configuration circuit 160 (see also FIG. 1) or provided by the instruction decoder 120, control which match signals from other CAM rows are selected as IMS (e.g., as row enable signals) to ML pre-charge circuit 302 of CAM row 300, and also control whether row match signals generated on CML are provided to the PRS 150 for use as IMS signals by the same and/or one or more other arbitrarily selected CAM rows. In this manner, PRS 150 provides a programmable interconnect structure that can be dynamically configured to route match signals from any CAM row to itself and/or to one or more other arbitrarily selected CAM rows at the same time and independently of each other.

A general operation of the pre-charge circuit 302 is as follows. If ST is asserted to logic high, which indicates that row 300 of CAM cells 112 stores a first word in a data word chain, pre-charge circuit 302 turns on and, upon assertion of PCLK, pulls ML high toward VDD, thereby pre-charging ML and enabling the CAM row 300 for comparison operations, irrespective of the state of the row enable signal (ROW_EN) on the IMS line. Once ML is pre-charged, the data stored in CAM cells 112 of row 300 can be compared with input data (e.g., a search key), and the match signals are provided on ML.

If ST is de-asserted to logic low, which indicates that row 300 of CAM cells 112 stores either an intermediate word or the last word in a data word chain, then the logic state of ROW_EN on the IMS line controls the match line pre-charge operation. More specifically, if the state of ROW_EN on the IMS line received from the PRS 150 is asserted to indicate a match condition in another selected CAM row (e.g., that stores a previous word in the data word chain), the pre-charge circuit 302 turns on and pulls the match line ML high toward VDD, thereby pre-charging ML and enabling the CAM row 300 for comparison operations. Conversely, if the state of ROW_EN on the IMS line received from the PRS 150 is de-asserted to indicate a mismatch condition in the other CAM row, then pre-charge circuit 302 does not pre-charge the match line ML of the row 300, thereby disabling the CAM row 300 for the compare operation and causing a mismatch condition on the CAM row's match line ML.

To store regular expressions that specify a quantified number {n} of a character or character class, the character or character class can be stored {n} times in the embodiments of the CAM device 100 described above. For example, storing the regular expression REG4="acid[w-z]{5000}rain" in embodiments of the CAM device 100 described above would involve storing the character class [w-z] 5000 times (i.e., in 5000 corresponding groups of CAM rows), thereby consuming a large portion of the CAM device 100 to store a single regular expression. As a result, it may not be feasible to store regular expressions having large quantifiers in the above-described embodiments of CAM device 100. Applicants note that a single character can be represented as a character class having only one specified character (e.g., the character "a" can be represented as the character class [a]).

Counters can be used to count the number of characters of an input string that match a quantified character or character class of a regular expression, for example, so that the quantified character or character class does not need to be stored in multiple rows of the CAM array. However, for regular expressions that include quantifiers (e.g., *, +, ?, {n}, {n,m}) for which multiple overlapping substrings of an input string can concurrently match the regular expression, multiple counters are required to maintain a separate count value for each potentially matching substring, as described above. Although a different counter can be assigned to each potentially matching substring to individually track the number of matching characters for overlapping input substrings, this approach requires as many counters are matching substrings, which for some regular expressions can be unlimited. Another solution is to use a counter circuit that includes a FIFO element or shift register that can store multiple counter entries corresponding to multiple overlapping substrings. However, the number of overlapping strings that can be managed by such counter circuits is limited by the number of FIFO entries or the number of register stages, and typically requires complex control circuitry.

Thus, in accordance with the present embodiments, the CAM arrays described above with respect to FIGS. 1-3 can be modified to include one or more embedded configurable counter circuits that can be programmed to count the number of sequential input characters associated with a quantified character or character class specified in a regular expression. The counter circuit can be interconnected via the PRS 150 to form a loop that counts the number of sequential occurrences of the quantified character or character class so that the quantified character or character class can be stored in only one set of CAM row(s), irrespective of the quantifier value.

More specifically, the configurable counter circuits disclosed herein are suited to implement various quantifiers in regular expressions without unrolling the regular expressions and without the use of shift registers or FIFO buffers to maintain separate count values for multiple overlapping portions of an input string that potentially match a regular expression, thereby allowing regular expression search operations to be performed using a TCAM-based search engine having minimal counter resources. In addition, some embodiments of the counter circuits disclosed herein can be selectively enabled to identify matching portions of the input string that have a specified minimum number of characters. For such embodiments, the counter circuit is responsive to a mode select signal that indicates a normal (NRML) mode of operation or a minimum match length (MML) mode of operation.

Figure 4:
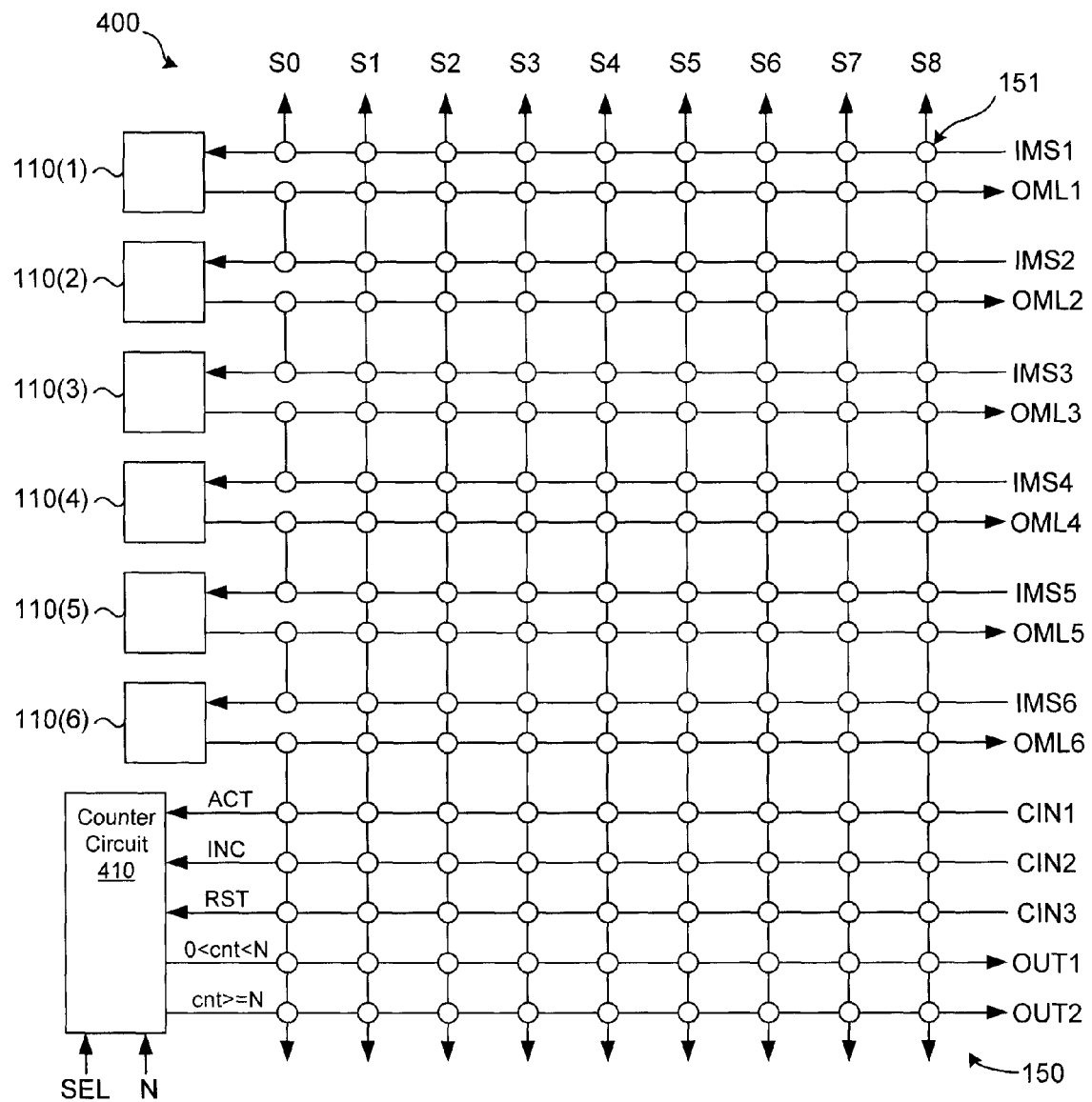
FIG. 4 shows a counter circuit embedded within one embodiment of the CAM array of FIG. 2.

FIG. 4 shows a CAM array 400 having an embedded counter circuit 410 in accordance with some embodiments. More specifically, CAM array 400 is one embodiment CAM array 102 of FIG. 2, and includes a plurality of CAM rows 110(1)-110(6), and counter circuit 410 coupled to PRS 150, which is shown in FIG. 4 as including a plurality of state signal lines S0-S8 selectively coupled to the OML and IMS lines of the CAM rows by configurable switches 151. Each switch 151, which can be any suitable type of switching element (e.g., a pass transistor, a pass gate, a fuse, and so on), selectively connects a corresponding row match line (e.g., either the OML or IMS line) and a corresponding state signal line together in response to a routing configuration bit (not shown for simplicity). The routing configuration bits for all of the switches 151 within the PRS of FIG. 4 form one embodiment of the routing configuration data (RCFG) of FIG. 1.

For exemplary embodiments described herein, counter circuit 410 is configured to maintain a count value CNT, and includes 3 data inputs, 2 control inputs, and 2 data outputs. The control inputs receive a target count value N and a mode select signal SEL. The data inputs receive an active signal (ACT), an increment signal (INC), and a reset signal (RST) from the PRS 150. The data outputs provide output signals OUT1 and OUT2 to the PRS 150, where OUT1 indicates whether 0<CNT<N, and OUT2 indicates whether CNT≧N. Thus, for some embodiments, OUT1 indicates whether the count value CNT generated by counter circuit 410 is less than the target value N, and OUT2 indicates whether the count value CNT generated by counter circuit 410 is greater than or equal to the target value N. In operation, counter circuit 410 selectively increments the count value CNT in response to the 3 input signals ACT, INC, and RST, which as described below allows counter circuit 410 to be employed with CAM rows 110 and the PRS 150 to implement search operations for regular expressions having most types of metacharacters and quantifiers without using large shift registers and/or FIFO elements. The input signals ACT, INC, and RST can be generated by CAM rows 110 to indicate matches between input characters and strings, characters, character classes, and/or wildcards stored in CAM rows 110. In addition, the mode select signal SEL can be used to select a normal mode of operation (NRML) or a minimum match length mode of operation (MML) for counter circuit 410. For some embodiments, a de-asserted state (e.g., logic low) of SEL indicates the NRML operational mode, and an asserted state (e.g., logic high) of SEL indicates the MML operational mode.

In either operational mode, de-assertion of ACT (e.g., to logic low) disables counter circuit 410, and assertion of ACT (e.g., to logic high) enables counter circuit 410. When enabled and operating in the normal mode, counter circuit 410 increments its count value CNT by one in response to each assertion of INC if RST is de-asserted. If INC is not asserted, then counter circuit 410 does not increment CNT. Thus, for example, to count the number of sequential characters of an input string that match a character stored in CAM row 110(1), the output match line (OML) of CAM row 110(1) can be routed as INC to counter circuit 410 via the PRS 150 so that each match between an input character and the data stored in CAM row 110(1) results in a separate assertion of INC and thus a separate increment of CNT. If RST is asserted (e.g., to logic high), counter circuit 410 resets CNT to zero. For example, assertion of RST can be used to reset the counter circuit 410 after a match is detected. For some embodiments, counter circuit 410 continually compares CNT with N to generate the output signals OUT1 and OUT2. More specifically, OUT1 is asserted (e.g., to logic high) only if 0<CNT<N, and OUT2 is asserted (e.g., to logic high) only if CNT≧N.

The logic operations of counter circuit 410 for selectively incrementing the count value CNT in response to the 3 input signals for the NRML mode of operation are summarized below in Table 3, where CNT=0 indicates resetting CNT to zero, and CNT++ indicates incrementing CNT by one.

TABLE 3

| ACT | INC | RST | counter action |
| --- | --- | --- | --- |
| 0 | x | x | CNT = 0 |
| 1 | 0 | 0 | none |
| 1 | 0 | 1 | CNT = 0 |
| 1 | 1 | 0 | CNT++ |
| 1 | 1 | 1 | CNT = 0 |

As mentioned above, counter circuit 410 can also operate in a minimum-match length mode (MML) to identify matching portions of the input string that have a specified minimum number of characters. During the MML mode, the reset signal (RST) is used as a check match length signal to check the character length of a matching string. For some embodiments, the first output signal OUT1=0<CNT<N is not used in the MML mode. In operation, when counter circuit 410 is enabled in the MML mode, counter circuit 410 increments CNT by one in response to each assertion of INC. If RST is de-asserted, counter circuit 410 does not generate the output signal CNT≧N. Conversely, if RST is asserted while CNT is incremented in response to INC, counter circuit 410 checks the match length by outputting the second output signal OUT2=CNT≧N as a match signal. If INC is not asserted, counter circuit 410 maintains the current value of CNT, regardless of RST. The logic operations of counter circuit 410 for selectively incrementing the count value CNT in response to the 3 input signals for the MML mode are summarized below in Table 4.

TABLE 4

| ACTIVE | INC | RST | counter action |
|---|---|---|---|
| 0 | x | x | CNT = 0 |
| 1 | 0 | 0 | none |
| 1 | 0 | 1 | none |
| 1 | 1 | 0 | CNT++; do not output CNT ≧ N signal |
| 1 | 1 | 1 | CNT++; output CNT ≧ N signal |

For some embodiments, counter circuit 410 stores the value N−1 as the target value so the output signals can be generated in the same clock cycle that the input signals are received. For such embodiments, the counter circuit 410 compares the value N−1 with CNT to generate the output signals OUT1 and OUT2.

By using a selectable combination of 3 input signals to control the incrementing of CNT and the generation of the output signals, counter circuit 410 can perform counting functions for regular expressions that include many different combinations of metacharacters and quantifiers. For example, present embodiments of counter circuit 410 can maintain separate character match count values for a plurality of overlapping substrings that concurrently match the same regular expression without using shift registers or FIFO memories. In addition, counter circuit 410 can implement non-greedy match operations by employing a killer track that effectively disables the counter circuit 410 after a match condition is detected, as described below. For some embodiments, a killer bit can be used to control the killer track in the PRS 150.

Figure 5:
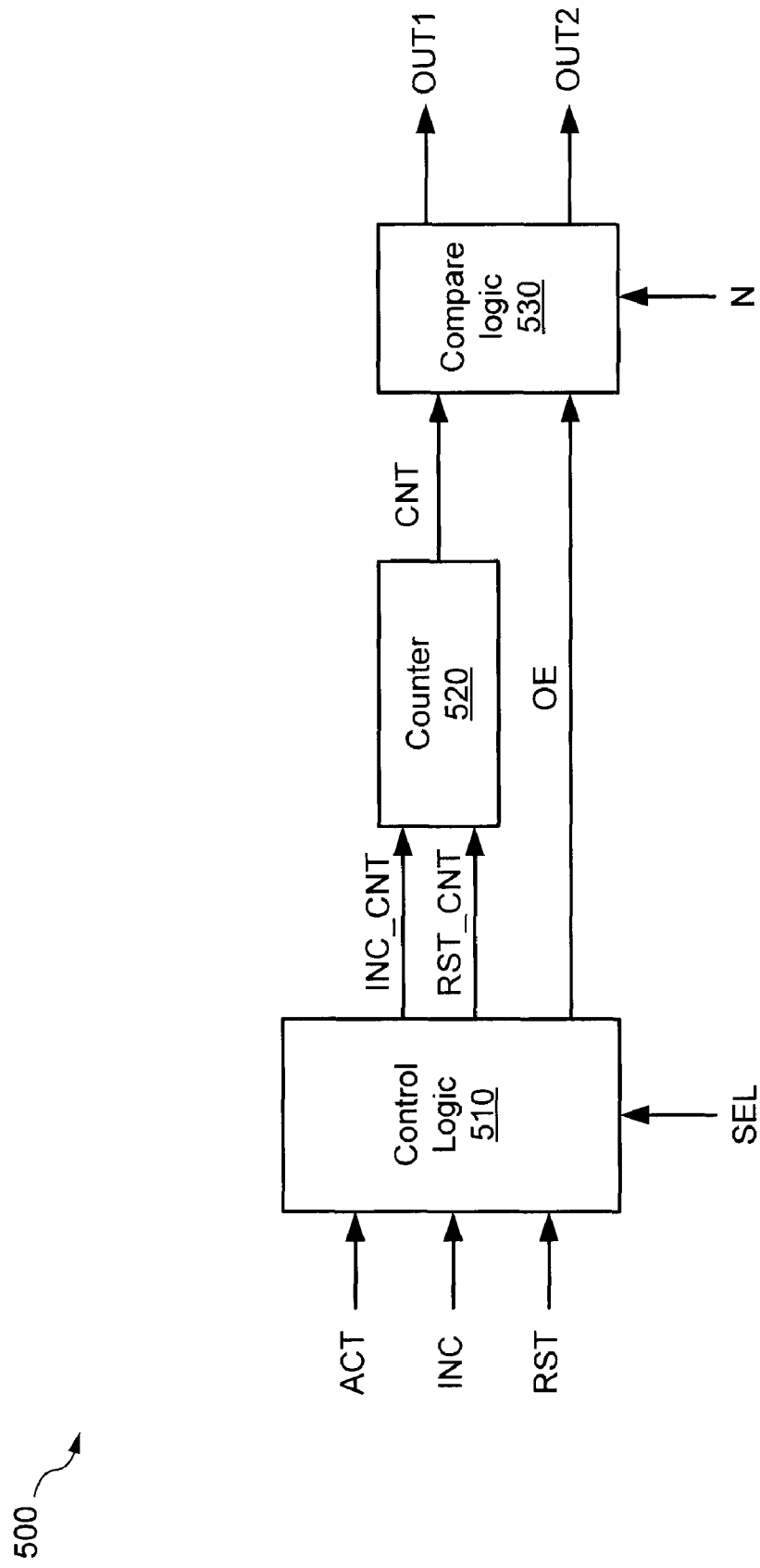
FIG. 5 shows a block diagram of one embodiment of the counter circuit of FIG. 4.

FIG. 5 shows a counter circuit 500 that is one embodiment of counter circuit 410 of FIG. 4. Counter circuit 500 includes control logic 510, a counter 520, and compare logic 530. Control logic 510 includes inputs to receive the input signals ACT, INC, and RST, a control input to receive SEL, and outputs to provide signals INC_CNT and RST_CNT to counter 520. Control logic 510 also includes an output to generate an output enable signal (OE) for compare logic 530. Counter 520, which can be any suitable binary counter, generates the count value CNT in response to INC_CNT and RST_CNT. For some embodiments, counter 520 increments CNT by one only upon an assertion of INC_CNT, and resets CNT to zero only when RST_CNT is asserted. RST_CNT logic 530 includes a data input to receive CNT from counter 520, a first control input to receive the output enable signal (OE) from control logic 510, a second control input to receive the target value N, and outputs to generate output signals OUT1 and OUT2. Although not shown in FIG. 5 for simplicity, compare logic 530 includes a memory element to store the target value N (or alternatively, the target value N−1).

The components of counter circuit 500 perform the logic functions summarized above in Tables 3 and 4, depending upon the state of SEL. Thus, when SEL is in a first state (e.g., logic 0), counter circuit 500 operates in the NRML mode according to the logic states summarized in Table 3, and when SEL is in a second state (e.g., logic 1), counter circuit 500 operates in the MML mode according to the logic states summarized in Table 4.

The implementation of search operations for a variety of regular expressions using CAM devices of the presents embodiments are described below with respect to FIGS. 6A-6H, where a solid dot in the PRS 150 indicates a conductive switch 151 and an open circle in the PRS 150 indicates a non-conductive switch 151. For the exemplary embodiments described herein, the match signals generated on the CAM row output lines OML and routed to counter circuit 410 as ACT, INC, and RST via the state signal lines of PRS 150 are asserted (e.g., active) for one cycle, and similarly, the counter circuit output signals OUT1 and OUT2 routed to CAM rows 110 as row enable signals via the state signal lines of PRS 150 are asserted (e.g., active) for one cycle.

Figure 6A:
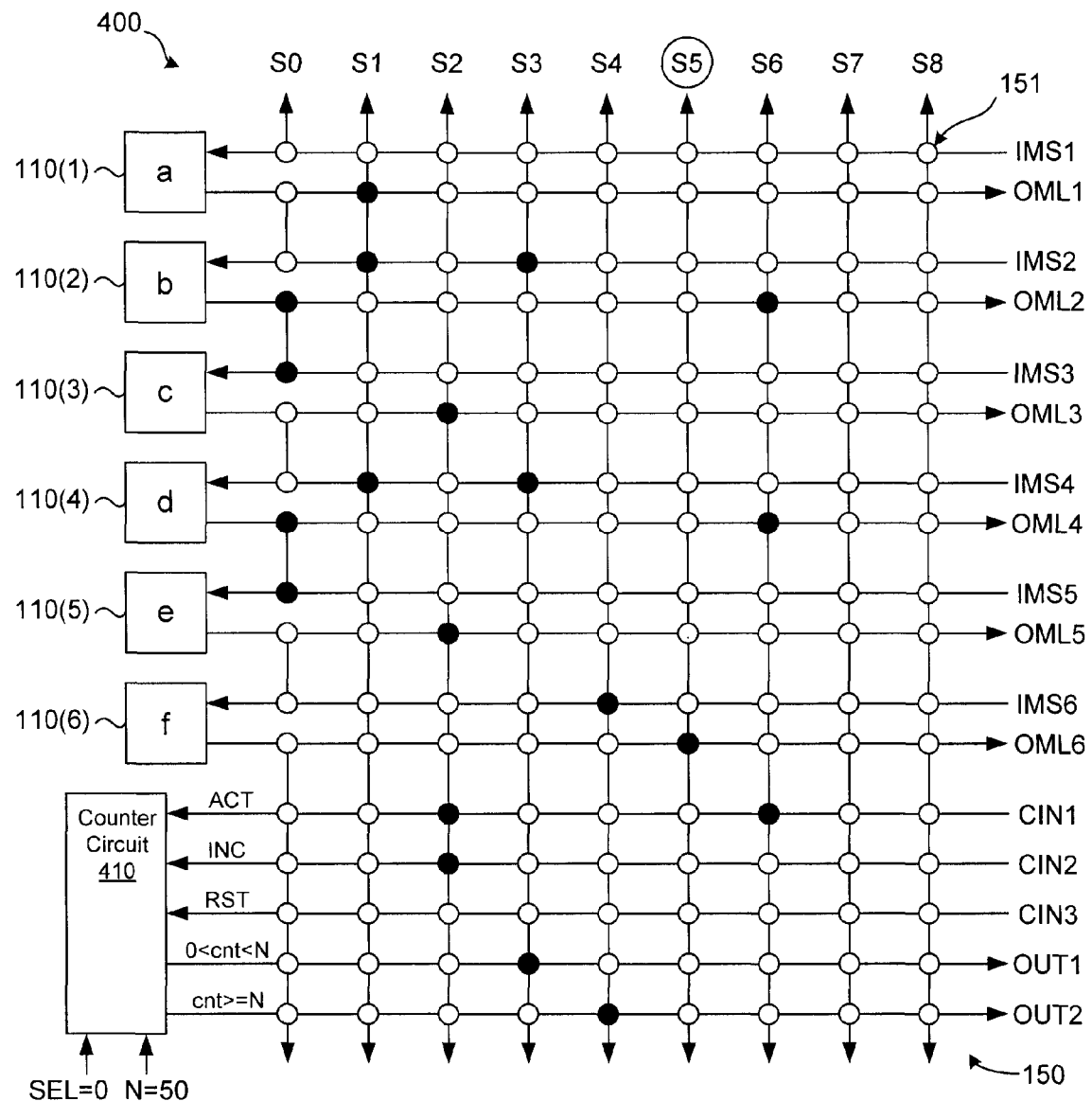
FIG. 6A shows an embodiment of the CAM array of FIG. 4 configured to implement search operations for the regular expression $R_A$=a(bc|de)$\{50\}$f.

FIG. 6A shows CAM array 400 configured to store and implement search operations for the regular expression $R_A$=a (bc|de){50}f. For $R_A$, the characters a-f are stored in CAM rows 110(1)-110(6), respectively, of CAM array 400. The OML of CAM row 110(2) is connected to the IMS line of CAM row 110(3), thereby forming the string "bc" by enabling CAM row 110(3) for a compare operation if there is a match in CAM row 110(2) in a previous compare operation. Similarly, the OML of CAM row 110(4) is connected to the IMS line of CAM row 110(5), thereby forming the string "de" by enabling CAM row 110(5) for a compare operation if there is a match in CAM row 110(4) in a previous compare operation. The alternation symbol "|" is implemented by connecting the OML line of CAM row 110(1) to the IMS lines of CAM rows 110(2) and 110(4) so that a match between an input character and "a" of $R_A$ in a compare operation will concurrently trigger (e.g., enable) searches for the strings "bc" and "de" in next compare operations.

The quantifier {50} is implementing by storing N=50 in counter circuit 410, by connecting the OML lines of CAM rows 110(3) and 110(5) to the ACT and INC inputs of counter circuit 410, and by connecting the OUT1=0<CNT<N line of counter circuit 410 to the IMS lines of CAM rows 110(2) and 110(4). In addition, the OUT2=CNT≧N line of counter circuit 410 is connected to the IMS line of CAM row 110(6). In this manner, each time a match is detected between the input string and either the strings "bc" or "de" of $R_A$, assertion of the corresponding match signal is routed as asserted ACT and INC signals to counter circuit 410, which in response thereto increments CNT by one. So long as 0<CNT<N, counter circuit 410 asserts OUT1, which in turn enables CAM rows 110(2) and 110(4) for the next compare operation. Also note that the OML of CAM rows 110(2) and 1104) are connected to the ACT input of counter circuit 410. This ensures that the ACT signal remains high upon matches between the input string and either the "b" stored in CAM row 110(2) or the "d" stored in CAM row 110(4) (e.g., if ACT is de-asserted, counter circuit 410 resets CNT=0). Thereafter, when CNT becomes equal to N, which indicates that an input string contains the prefix "a" followed by 50 instances of "bc" of "de," counter circuit 410 de-asserts OUT1 and asserts OUT2. The de-assertion of OUT1 disables CAM rows 110(2) and 110(4) for the next compare operation, and the assertion of OUT2 enables CAM row 110(6) for the next compare operation. Then, if the next input character is an "f," CAM row 110(6) asserts the match signal on its OML, which is routed as a regular expression match signal on state signal line S5 (which is circled in FIG. 6A to indicate that it carries the regular expression match signal).

Figure 6B:
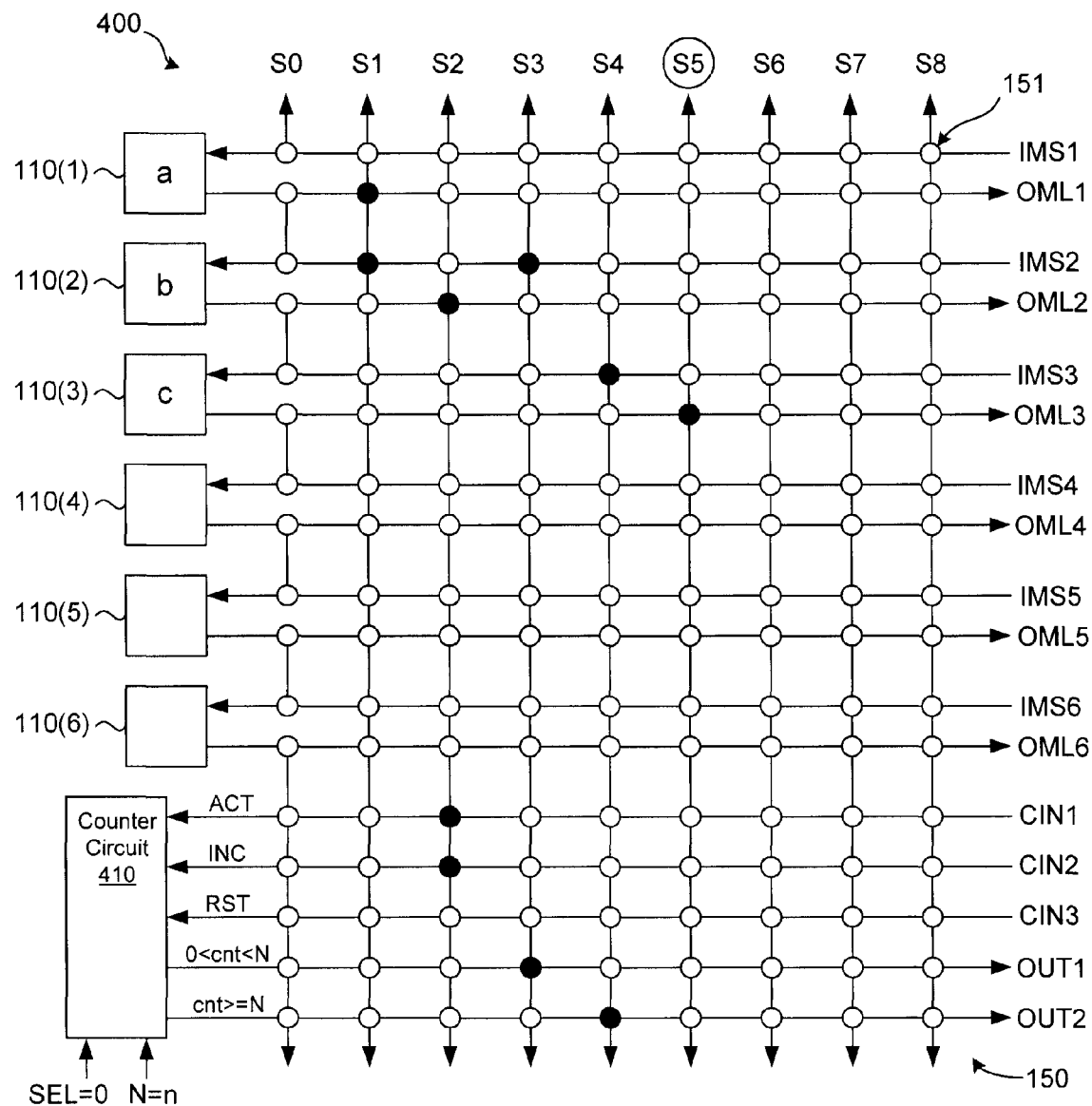
FIG. 6B shows an embodiment of the CAM array of FIG. 4 configured to implement search operations for the regular expression $R_B$=ab$\{n\}$c.

FIG. 6B shows an embodiment of the CAM array of FIG. 4 configured to implement search operations for the regular expression $R_B$=ab{n}c. For $R_B$, the characters a-c are stored in CAM rows 110(1)-110(3), respectively, of CAM array 400. The OML of CAM row 110(1) is connected to the IMS line of CAM row 110(2) to form the string "ab" by enabling CAM row 110(2) for a compare operation only if there is a match in CAM row 110(1) in a previous compare operation. The quantifier {n} is implementing by storing N=n in counter circuit 410, by connecting the OML line of CAM row 110(2) to the ACT and INC inputs of counter circuit 410, and by connecting the OUT1=0<CNT<N line of counter circuit 410 to the IMS line of CAM row 110(2). In addition, the OUT2=CNT≧N line of counter circuit 410 is connected to the IMS line of CAM row 110(3). In this manner, each time a match is detected between the input string and the character "b" of $R_B$, assertion of the corresponding match signal on OML2 is routed as asserted ACT and INC signals to counter circuit 410, which in response thereto increments CNT by one. So long as 0<CNT<n, counter circuit 410 asserts OUT1, which in turn enables CAM row 110(2) for the next compare operation. When CNT becomes equal to n, which indicates that an input string contains the prefix "a" followed by n instances of "b," counter circuit 410 de-asserts OUT1 and asserts OUT2. The de-assertion of OUT1 disables CAM row 110(2) for the next compare operation, and the assertion of OUT2 enables CAM row 110(3) for the next compare operation. Then, if the next input character is a "c," CAM row 110(3) asserts the match signal on its OML, which is routed as a regular expression match signal on state signal line S5.

Figure 6C:
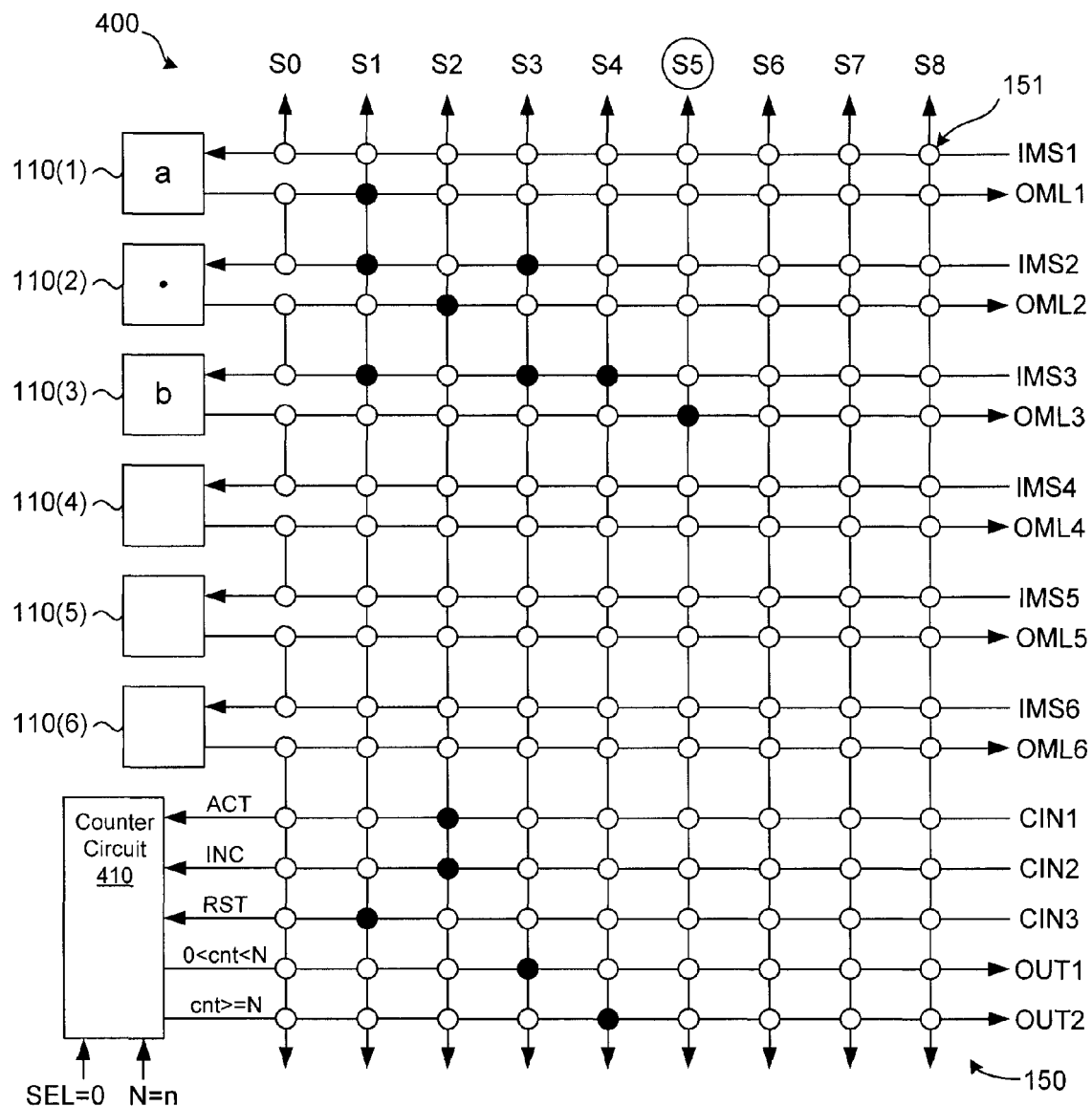
FIG. 6C shows an embodiment of the CAM array of FIG. 4 configured to implement search operations for the regular expression $R_C$=a.$\{0,n\}$b.

FIG. 6C shows an embodiment of the CAM array of FIG. 4 configured to implement search operations for the regular expression $R_C$=a.{0,n}b, which requires an input string to include the prefix "a" followed by zero or more instances of any character followed by the suffix "b." For $R_C$, the character "a" is stored in CAM row 110(1), the wildcard "." is stored in CAM row 110(2), and the character "b" is stored in CAM row 110(3). The wildcard character can be stored as a don't care in the TCAM cells of row 110(2). The OML of CAM row 110(1) is connected to the IMS lines of CAM rows 110(2) and 110(3), thereby enabling CAM rows 110(2) and 110(3) for a compare operation if there is a match in CAM row 110(1) in a previous compare operation. The quantifier {0,n} is implementing by storing N=n in counter circuit 410, by connecting the OML line of CAM row 110(1) to the RST input of counter circuit 410, by connecting the OML line of CAM row 110(2) to the ACT and INC inputs of counter circuit 410, by connecting the OUT1=0<CNT<N line of counter circuit 410 to the IMS lines of CAM rows 110(2) and 110(3), and by connecting the OUT2=CNT≧N line of counter circuit 410 to the IMS line of CAM row 110(3). In this manner, upon detection of an "a" in the input string, CAM rows 110(2) and 110(3) are enabled for the next compare operation. Thereafter, each subsequent character in the input string that matches the wildcard "." causes CAM row 110(2) to assert the ACT and INC input signals to counter circuit 410, which in response thereto increments CNT by one. If any of these subsequent characters is a "b," CAM row 110(3) asserts the match signal on its OML, which is routed as a regular expression match signal on state signal line S5. So long as 0<CNT<n, counter circuit 410 asserts OUT1, which in turn enables CAM rows 110(2) and 110(3) for the next compare operation. When CNT becomes equal to N=n, which indicates that an input string contains the prefix "a" followed by n additional characters, counter circuit 410 de-asserts OUT1 and asserts OUT2. The de-assertion of OUT1 disables CAM row 110(2) for the next compare operation, and the assertion of OUT2 enables CAM row 110(3) for the next compare operation. Then, if the next input character is a "b," CAM row 110(3) asserts the match signal on its OML, which is routed as a regular expression match signal on state signal line S5.

The regular expression $R_C$ is complex because multiple overlapping portions of an input string can concurrently match $R_C$. For example, consider a search operation between the input string IN1="axxaxxbxb" and $R_C$=a.{0,5}b. The first input character "a" matches CAM row 110(1), which asserts the match signal on OML1 to enable CAM rows 110(2) and 110(3) for the next compare operation. The asserted match signal on OML1 is also routed as RST to counter circuit 410, which in response thereto resets CNT=0. The second character "x" matches CAM row 110(2), which asserts ACT and INC to cause counter circuit 410 to increment the count value to CNT=1. Because 0<CNT<5, counter circuit 410 asserts OUT1 to enable CAM rows 110(2) and 110(3) for the next compare operation, and de-asserts OUT2. The third character "x" matches CAM row 110(2), which asserts ACT and INC to cause counter circuit 410 to increment the count value to CNT=2. Because 0<CNT<5, counter circuit 410 asserts OUT1 to enable CAM rows 110(2) and 110(3) for the next compare operation. The fourth character "a" matches CAM rows 110(1) and 110(2), which both assert their OML. The asserted match signal on OML1 drives RST to logic high, thereby causing counter circuit 410 to reset CNT=0 and to ignore the asserted ACT and INC signals routed from CAM row 110(2), as indicated in Table 3. Because 0<CNT<5, counter circuit 410 asserts OUT1 to enable CAM rows 110(2) and 110(3) for the next compare operation. The fifth character "x" matches CAM row 110(2), which asserts ACT and INC to cause counter circuit 410 to increment the count value to CNT=1. Because 0<CNT<5, counter circuit 410 asserts OUT1 to enable CAM rows 110(2) and 110(3) for the next compare operation. The sixth character "x" matches CAM row 110(2), which asserts ACT and INC to cause counter circuit 410 to increment the count value to CNT=2. Because 0<CNT<5, counter circuit 410 asserts OUT1 to enable CAM rows 110(2) and 110(3) for the next compare operation. The seventh character "b" matches CAM rows 110(2) and 110(3), which both assert their match signals. The match signal from CAM row 110(2) asserts ACT and INC to cause counter circuit 410 to increment the count value to CNT=3, and because 0<CNT<5, counter circuit 410 asserts OUT1 to enable CAM rows 110(2) and 110(3) for the next compare operation. The match signal from CAM row 110(3) is routed to S5 to indicate a first substring match (e.g., "axxaxxb").

Then, the eighth character "x" matches CAM row 110(2), which asserts ACT and INC to cause counter circuit 410 to increment the count value to CNT=4. Because 0<CNT<5, counter circuit 410 asserts OUT1 to enable CAM rows 110(2) and 110(3) for the next compare operation. The ninth character "b" matches CAM rows 110(2) and 110(3), which both assert their match signals. The match signal from CAM row 110(2) on OML2 asserts ACT and INC to cause counter circuit 410 to increment the count value to CNT=5. Because CNT≧5, counter circuit 410 de-asserts OUT1 and asserts OUT2. The de-asserted OUT1 signal disables CAM row 110(2), and the asserted OUT2 signal enables CAM row 110(3) for the next compare operation. The match signal from CAM row 110(3) is routed to S5 to indicate a second substring match (e.g., "axxbxb"). If a next input character is a "b," CAM row 110(3) would assert its match signal on OML3 to indicate another match. The disabled CAM row 110(2) does not assert its match signal, and the resulting de-asserted state of ACT causes counter circuit 410 to reset CNT=0, thereby leading to the de-assertion of OUT2 and thus the disabling of CAM row 110(3).

By resetting the count value CNT=0 in response to the first character in each potentially matching substring (e.g., using the RST signal) and asserting OUT1 to continue enabling the quantified character matches (e.g., in CAM row 110(2)), counter circuit 410 can be used to detect the occurrence of multiple overlapping matching portions of an input string using only a binary counter and associated control logic. In this manner, counter circuit 410 can be used for implementing quantified character searches for regular expressions without using multiple counters and without using a shift register or FIFO element to store multiple count values corresponding to multiple overlapping matching portions of the input string. Note that the quantified sub-pattern ".{0,n}" is greedy because it will match as many times as is possible while still allowing the rest of the pattern to match.

Figure 6D:
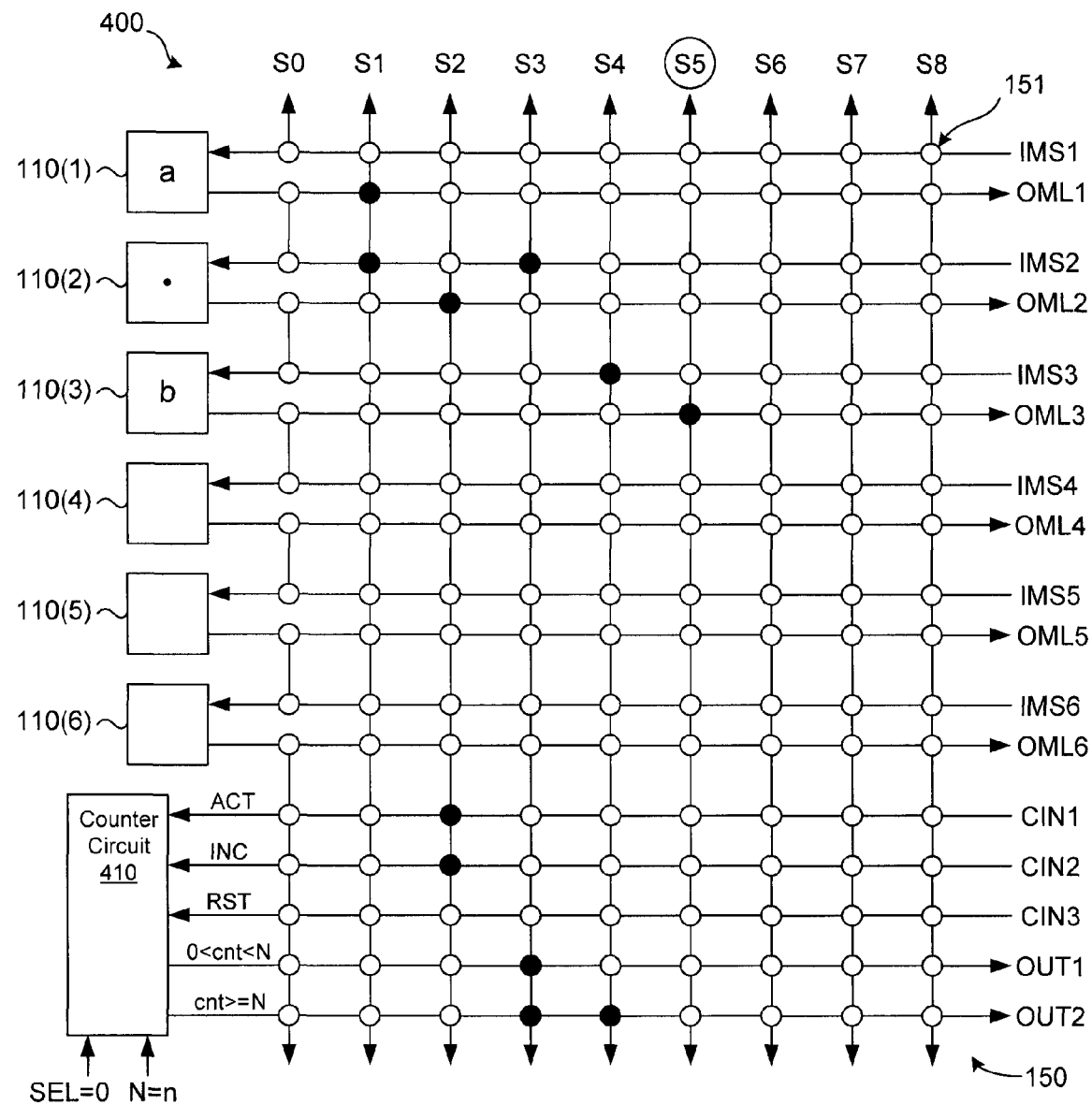
FIG. 6D shows an embodiment of the CAM array of FIG. 4 configured to implement search operations for the regular expression $R_D$=a.$\{n,\}$b.

FIG. 6D shows an embodiment of the CAM array of FIG. 4 configured to implement search operations for the regular expression $R_D$=a.{n,}b, which requires an input string to include the prefix "a" followed by n or more instances of any character followed by the suffix "b." For $R_D$, the character "a" is stored in CAM row 110(1), the wildcard "." is stored in CAM row 110(2), and the character "b" is stored in CAM row 110(3). The OML of CAM row 110(1) is connected to the IMS line of CAM row 110(2), thereby enabling CAM row 110(2) for a compare operation if there is a match in CAM row 110(2) in a previous compare operation. The quantifier {n,} is implemented by storing N=n in counter circuit 410, by connecting the OML line of CAM row 110(2) to the ACT and INC inputs of counter circuit 410, by connecting the OUT1 and OUT2 lines of counter circuit 410 to the IMS line of CAM row 110(2), and by connecting the OUT2 line of counter circuit 410 to the IMS line of CAM row 110(3). In this manner, upon detection of an "a" in the input string, CAM row 110(2) is enabled for the next compare operation. Thereafter, each subsequent character in the input string that matches the wildcard "." causes CAM row 110(2) to assert the ACT and INC input signals to counter circuit 410, which in response thereto increments CNT by one. So long as 0<CNT<n, counter circuit 410 asserts OUT1, which in turn enables CAM row 110(2) for the next compare operation. When CNT becomes equal to N=n, which indicates that an input string contains the prefix "a" followed by n additional characters, counter circuit 410 de-asserts OUT1 and asserts OUT2. The assertion of OUT2 enables CAM rows 110(2) and 110(3) for the next compare operation. Then, if the next input character is a "b," CAM row 110(3) asserts the match signal on its OML, which is routed as a regular expression match signal on state signal line S5.

Note that because $R_D$=a.{n,}b requires a matching substring to have at least n characters appearing after the initial "a," the match signal from CAM row 110(1) does not enable CAM row 110(3) and does not serve as the RST signal for counter circuit 410, as in the case for $R_C$=a.{0,n}b depicted in FIG. 6C. Also, in contrast to FIG. 6C, the OUT2 line of counter circuit 410 in FIG. 6D is routed as an enable signal to CAM row 110(2) so that CAM row 110(2) remains active and asserts ACT and INC (e.g., to increment CNT) upon each subsequent character match with the wildcard stored therein.

Figure 6E:
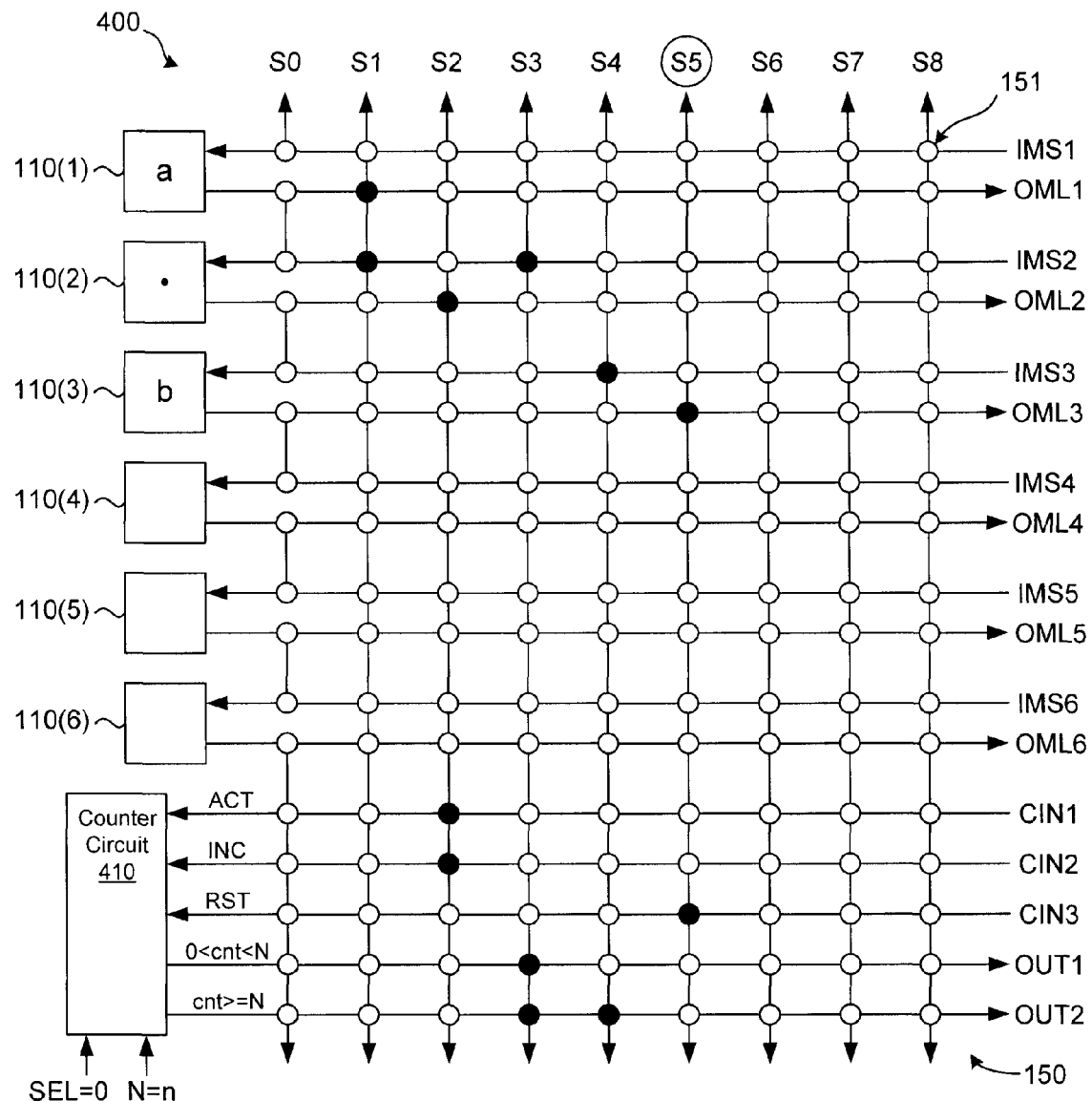
FIG. 6E shows an embodiment of the CAM array of FIG. 4 configured to implement search operations for the regular expression $R_E$=a.$\{n,\}$?b.

FIG. 6E shows an embodiment of the CAM array of FIG. 4 configured to implement search operations for the regular expression $R_E$=a.{n,}?b. The symbol "?" causes the quantifier "{n,}" to be non-greedy, which means that it will match the minimum number of times possible (e.g., the shortest possible matching substring is detected, and the search operation is terminated). The storage of characters in CAM rows 110(1)-110(3) and the configuration of the PRS 150 for FIG. 6E is the same as for FIG. 6D, except that the match signal from CAM row 110(3) is routed as RST to counter circuit 410. In this manner, when a match is detected between an input string and $R_E$=a.{n,}?b, as indicated by a match condition in CAM row 110(3), assertion of the match signal on OML3 causes counter circuit 410 to reset CNT=0, which in turn results in the de-assertion of OUT1 and OUT2 and thus the disabling of CAM rows 110(2) and 110(3).

Figure 6F:
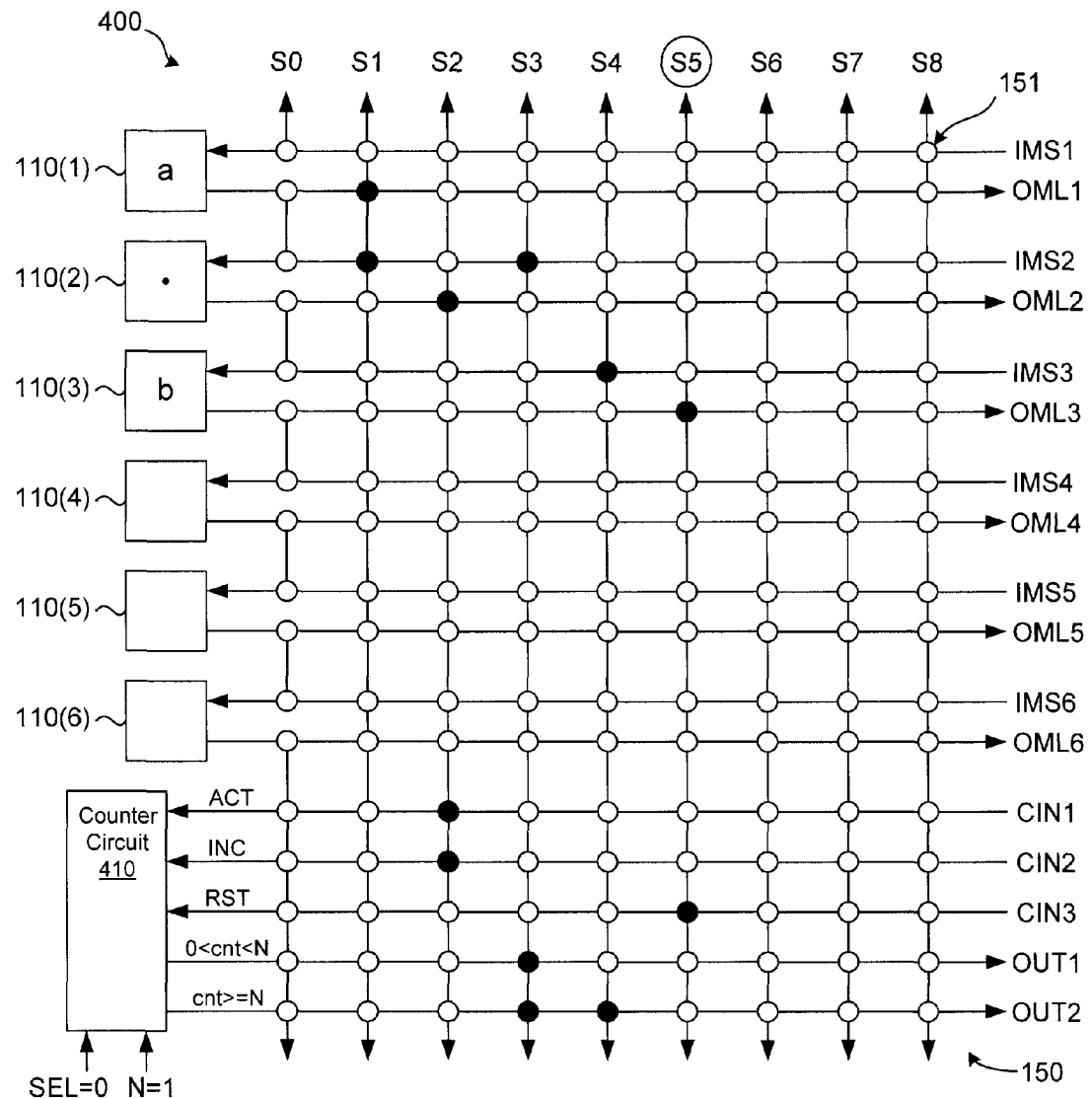
FIG. 6F shows an embodiment of the CAM array of FIG. 4 configured to implement search operations for the regular expression $R_F$=a.+?b.

FIG. 6F shows an embodiment of the CAM array of FIG. 4 configured to implement search operations for the regular expression $R_F$=a.+?b. The storage of characters in CAM rows 110(1)-110(3) and the configuration of the PRS 150 for FIG. 6F is the same as for FIG. 6E, except that the target value N=1 is stored in counter circuit 410. Note that the connection of the match signal from CAM row 110(3) to the RST input of counter circuit 410 makes the quantifier+non-greedy.

Figure 6G:
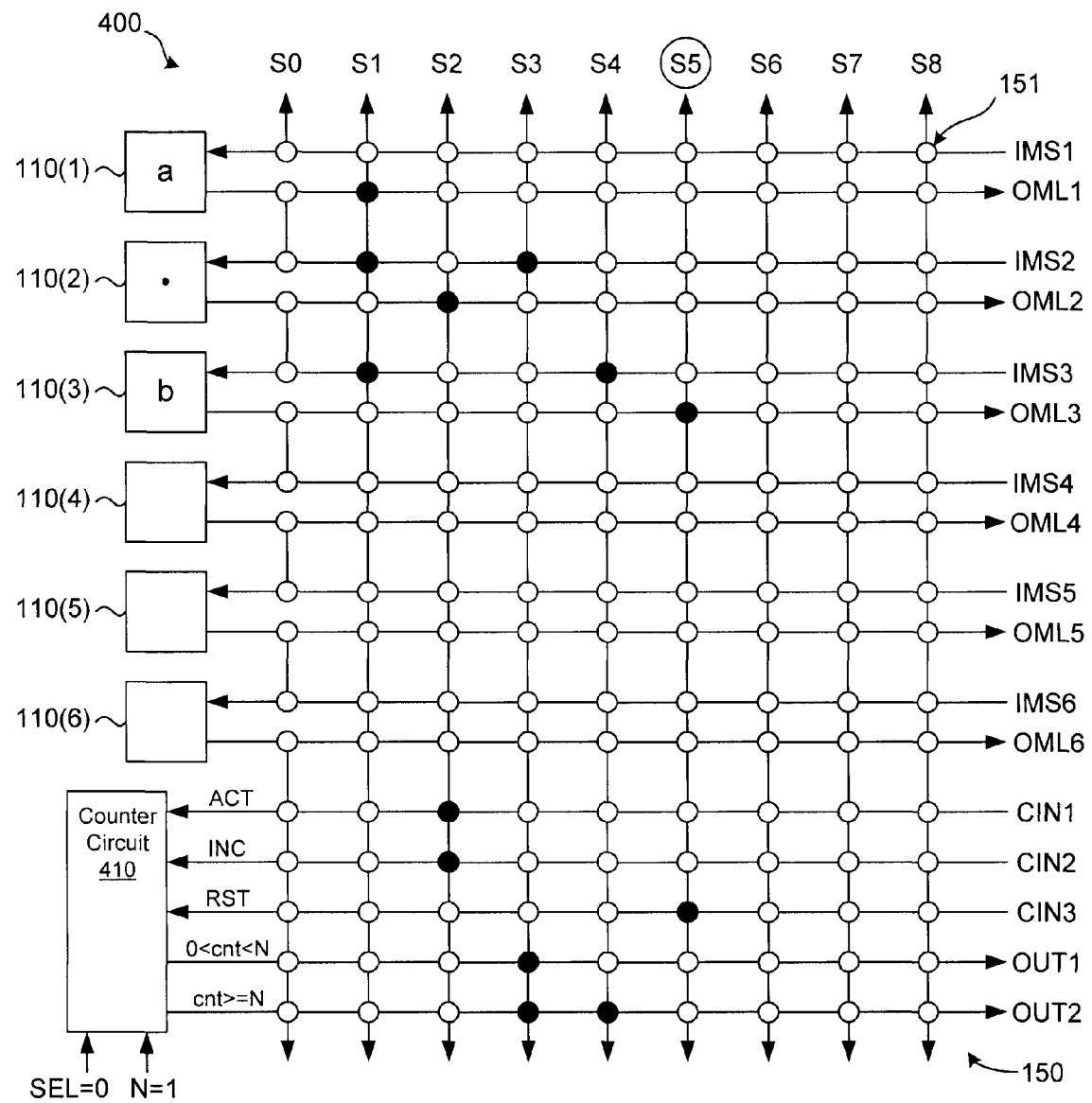
FIG. 6G shows an embodiment of the CAM array of FIG. 4 configured to implement search operations for the regular expression $R_G$=a.*?b.

FIG. 6G shows an embodiment of the CAM array of FIG. 4 configured to implement search operations for the regular expression $R_G$=a.*?b. The storage of characters in CAM rows 110(1)-110(3) and the configuration of the PRS 150 for FIG. 6G is the same as for FIG. 6F, except that the match signal from CAM row 1110(1) is also routed to the IML3 line of CAM row 110(3). In this manner, a match between an "a" in the input string and the "a" stored in CAM row 110(1) concurrently enables CAM rows 110(2) and 110(3), thereby allowing an input string with 0 or more instances of any characters between the prefix "a" and suffix "b" to match $R_G$=a.*?b. Note that the connection of the match signal output from CAM row 110(3) to the RST input of counter circuit 410 makes the quantifier * non-greedy.

Figure 6H:
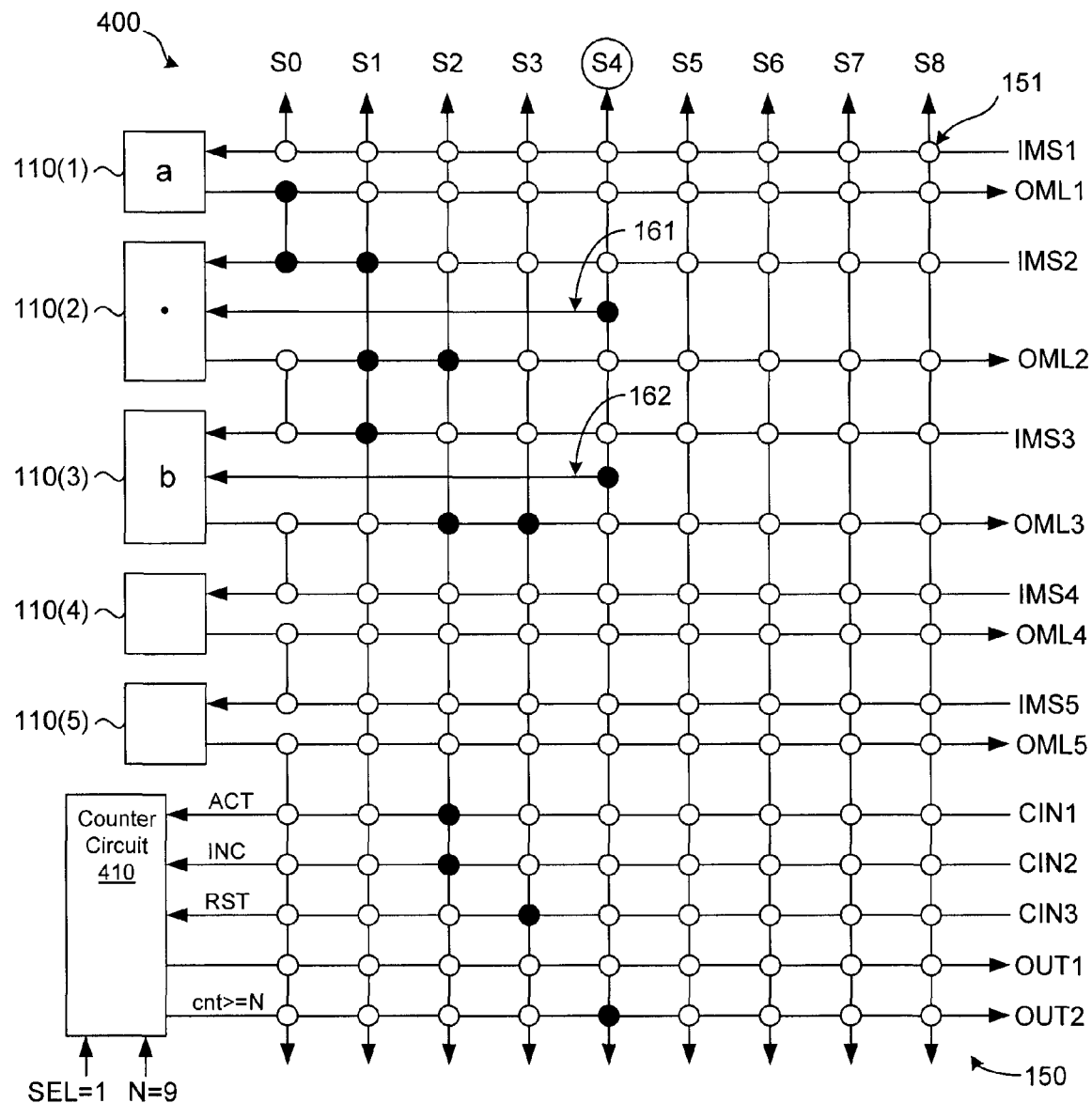
FIG. 6H shows an embodiment of the CAM array of FIG. 4 configured to implement search operations for the regular expression $R_H$=a.+b with a minimum match length value of MML=10.

FIG. 6H shows an embodiment of the CAM array of FIG. 4 configured to implement search operations for the regular expression $R_H$=a.+b with a minimum match length value of MML=10. The storage of characters in CAM rows 110(1)-110(3) is the same as for FIG. 6F. The OML of CAM row 110(1) is connected to the IML of CAM row 110(2) so that a match with "a" enable the wildcard CAM row 110(2) for the next compare operation. The OML of CAM row 110(2) is connected to the IML of CAM rows 110(2) and 110(3) so that a match with the wildcard in CAM row 110(2) enables both CAM rows 110(2) 110(3) for the next compare operation. The OMLs of CAM rows 110(2) and 110(3) are connected to the ACT and INC inputs of counter circuit 410 so that a match with either the wildcard stored in CAM row 110(2) or the "b" stored in CAM row 110(3) causes counter circuit 410 to increment CNT by one. The OML of CAM row 110(3) is also connected to the RST input of counter circuit 410 so that a match with the "b" stored in CAM row 110(3) causes counter circuit 410 to output the OUT2=CNT≧N signal to the PRS 150. Further, the mode select signal SEL is set to SEL=1, and the target N=9 is stored in counter circuit 410 so that the CAM array is configured to determine whether an input string of least 10 characters matches the regular expression $R_H$=a.+b. To implement the minimum match length, the search operation should terminate after a matching input string of the specified minimum length is detected.

More specifically, to terminate the search operation upon the match detection, the OUT2 of counter circuit 410 is coupled to CAM row 110(2) via a first "killer" line 161 and to CAM row 110(3) via a second killer line 161. When counter circuit 410 asserts OUT2 to indicate a match between a 10-character input string and the regular expression $R_H$, the asserted OUT2 signals is routed to disable inputs of CAM rows 110(2) and 110(3) via killer lines 161 and 162, respectively. In response thereto, CAM rows 110(2) and 110(3) are disabled, irrespective of the state of the input signals on their IMS lines. In this manner, when an input string having the specified minimum match length is detected, assertion of OUT2 by counter circuit 410 disables the CAM rows 110 and thereby terminates the search operation. For some embodiments, each CAM row can include a kill logic circuit (not shown for simplicity) having a first input to receive the input match signal from the row's IMS line, a second input to receive the kill signal from the row's killer line, and an output to provide the row enable signal to the row's match line pre-charge circuit (see also FIG. 3). Thus, for some embodiments, the kill logic circuit passes the input match signal to the match line pre-charge circuit 302 if the kill signal is not asserted and forces row enable signal to logic low (e.g., to disable the CAM row) if the kill signal is asserted.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A counter circuit configured to simultaneously maintain individual character match count values for a plurality of overlapping substrings of an input string of characters that match a portion of a regular expression stored in a plurality of rows of content addressable memory (CAM) cells of a ternary CAM device, comprising:
    control logic having inputs to receive an active signal, an increment signal, and a reset signal from one or more of the CAM rows, having a control input to receive a mode select signal, and having outputs to generate an increment counter signal, a reset counter signal, and an output enable signal;
    a counter circuit having inputs to receive the increment counter and reset counter signals, and having an output to generate a count value CNT; and
    compare logic having inputs to receive CNT, a target count value N, and the output enable signal, having a first output to generate a first output signal OUT1 indicating whether $0<CNT<N$, and having a second output signal OUT2 indicating whether $CNT \geq N$.

2. The counter circuit of claim 1, wherein an asserted state of the mode select signal indicates a minimal match length (MML) operational mode, and a de-asserted state of the mode select signal indicates a normal (NRML) operational mode.

3. The counter circuit of claim 2, wherein during the MML operational mode, the counter circuit is configured to identify only matching portions of the input string that have at least a specified minimum number of characters, and during the NRML operational mode, the counter circuit is configured to identify all matching portions of the input string.

4. The counter circuit of claim 3, wherein during the MML operational mode, the reset signal comprises a check match length signal that instructs the counter circuit to check the match length of each matching substring.

5. The counter circuit of claim 2, wherein:
    during the NRML operational mode, the counter increments CNT if the increment signal is asserted and the reset signal is de-asserted, and maintains the current value of CNT if the increment signal is de-asserted and the reset signal is de-asserted; and
    during the MML operational mode, if the increment signal is asserted, the counter increments CNT, and the compare logic outputs $OUT2=CNT \geq N$ if the reset signal is de-asserted and does not output $OUT2=CNT \geq N$ if the reset signal is asserted.

6. The counter circuit of claim 5, wherein:
    during the MML operational mode, if the increment signal is de-asserted, the counter maintains the current value of CNT irrespective of the reset signal.

7. The counter circuit of claim 6, wherein:
    during the NRML operational mode, if the reset signal is asserted, the counter resets CNT irrespective of the increment signal.

8. The counter circuit of claim 1, wherein each CAM row includes a match line to generate a match result and an enable input to receive an input match signal, and wherein the ternary CAM device further comprises:
    a programmable interconnect structure for selectively connecting the match line of any CAM row to any number of inputs of the counter control logic and for selectively connecting any number of the outputs of the counter compare logic to the enable input of any CAM row.

9. The counter circuit of claim 8, wherein the programmable interconnect structure is configured to selectively route match results from a first CAM row as the input match signal to any number of arbitrarily selected CAM rows at the same time.

10. The counter circuit of claim 8, wherein the match results provide the active, increment, and reset signals during a first compare operation.

11. The counter circuit of claim 10, wherein the counter circuit output signals selectively enable one or more CAM rows for a next compare operation.

12. The counter circuit of claim 8, wherein OUT1 is asserted in response to a match condition indicated on a first CAM row's match signal in a first compare operation and enables a second CAM row for a next compare operation.

13. The counter circuit of claim 8, wherein a first CAM row stores a character class specified by the regular expression, a second CAM row stores a suffix string specified by the regular expression, and the counter circuit detects overlapping sequences of N input characters that match the character class.

14. The counter circuit of claim 13, wherein if an input character matches the character class, the first CAM row asserts the active and increment signals, the counter increments CNT, and the counter compare logic asserts OUT1.

15. The counter circuit of claim 14, wherein the counter compare logic asserts OUT2 if $CNT \geq N$.

16. A counter circuit configured to simultaneously maintain individual character match count values for a plurality of overlapping substrings of an input string of characters that match a quantified character class of a regular expression, comprising:
    control logic having inputs to receive an active signal, an increment signal, and a reset signal, having a control input to receive a mode select signal, and having outputs to generate an increment counter signal, a reset counter signal, and an output enable signal;
    a counter circuit having inputs to receive the increment counter and reset counter signals, and having an output to generate a count value CNT; and
    compare logic having inputs to receive CNT, a target count value N, and the output enable signal, having an output to generate a first output signal OUT1 indicating whether $0<CNT<N$, and having a second output signal OUT2 indicating whether $CNT \geq N$, wherein an asserted state of the mode select signal indicates a minimal match length (MML) operational mode, and a de-asserted state of the mode select signal indicates a normal (NRML) operational mode.

17. The counter circuit of claim 16, wherein during the NRML operational mode, the counter circuit is configured to identify all portions of the input string that contain characters matching the character class.

18. The counter circuit of claim 16, wherein during the MML operational mode, the counter circuit is configured to identify only matching portions of the input string that have at least a specified minimum number of characters matching the character class.

19. The counter circuit of claim 16, wherein during the MML operational mode, the reset signal comprises a check match length signal that instructs the counter circuit to check the match length of each matching substring.

20. The counter circuit of claim 16, wherein:
during the NRML operational mode, the counter increments CNT if the increment signal is asserted and the reset signal is de-asserted, and maintains the current value of CNT if the increment signal is de-asserted and the reset signal is de-asserted; and
during the MML operational mode, if the increment signal is asserted, the counter increments CNT, and the compare logic outputs OUT2=CNT$\geq$N if the reset signal is de-asserted and does not output OUT2=CNT$\geq$N if the reset signal is asserted.

21. The counter circuit of claim 20, wherein:
during the MML operational mode, if the increment signal is de-asserted, the counter maintains the current value of CNT irrespective of the reset signal.

22. The counter circuit of claim 21, wherein:
during the NRML operational mode, if the reset signal is asserted, the counter resets CNT irrespective of the increment signal.

23. The counter circuit of claim 16, wherein the regular expression is stored in a plurality of rows of content addressable memory (CAM) cells of a ternary CAM device.

24. The counter circuit of claim 23, wherein each CAM row includes a match line to generate a match result and an enable input to receive an input match signal.

25. The counter circuit of claim 24, wherein the ternary CAM device further comprises:
a programmable interconnect structure for selectively connecting the match line of any CAM row to any number of inputs of the counter control logic and for selectively connecting any number of the outputs of the counter compare logic to the enable input of any CAM row.

26. The counter circuit of claim 25, wherein the programmable interconnect structure is configured to selectively route match results from a first CAM row as the input match signal to any number of arbitrarily selected CAM rows at the same time.

27. The counter circuit of claim 25, wherein the match results provide the active, increment, and reset signals during a first compare operation.

28. The counter circuit of claim 27, wherein the counter circuit output signals selectively enable one or more CAM rows for a next compare operation.

29. The counter circuit of claim 25, wherein OUT1 is asserted in response to a match condition indicated on a first CAM row's match signal in a first compare operation and enables a second CAM row for a next compare operation.

30. The counter circuit of claim 25, wherein a first CAM row stores the character class, a second CAM row stores a suffix string specified by the regular expression, and the counter circuit detects overlapping sequences of N input characters that match the character class.

31. The counter circuit of claim 30, wherein if an input character matches the character class, the first CAM row asserts the active and increment signals, the counter increments CNT, and the counter compare logic asserts OUT1.

32. The counter circuit of claim 31, wherein the counter compare logic asserts OUT2 if CNT$\geq$N.

* * * * *